(12) United States Patent
Tedrow

(10) Patent No.: US 11,988,967 B2
(45) Date of Patent: May 21, 2024

(54) TARGET MATERIAL SUPPLY APPARATUS AND METHOD

(71) Applicant: ASML Netherlands B.V., Veldhoven (NL)

(72) Inventor: Jon David Tedrow, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 485 days.

(21) Appl. No.: 17/280,969

(22) PCT Filed: Oct. 24, 2019

(86) PCT No.: PCT/US2019/057945
§ 371 (c)(1),
(2) Date: Mar. 29, 2021

(87) PCT Pub. No.: WO2020/086902
PCT Pub. Date: Apr. 30, 2020

(65) Prior Publication Data
US 2021/0311399 A1 Oct. 7, 2021

Related U.S. Application Data

(60) Provisional application No. 62/750,321, filed on Oct. 25, 2018.

(51) Int. Cl.
*G03F 7/00* (2006.01)
*H01J 37/34* (2006.01)

(52) U.S. Cl.
CPC ...... *G03F 7/70033* (2013.01); *H01J 37/3426* (2013.01)

(58) Field of Classification Search
CPC .............. G03F 7/70033; H01J 37/3426
See application file for complete search history.

(56) References Cited

U.S. PATENT DOCUMENTS 5,598,200 A 1/1997 Gore
6,224,180 B1 5/2001 Pham-Van-Diep et al.
(Continued)

FOREIGN PATENT DOCUMENTS

CN 101598905 A 12/2009
CN 101762986 A 6/2010
(Continued)

OTHER PUBLICATIONS

"Semiconductor Processing Equipment," Research Disclosure, database No. RD652052, Jul. 17, 2018.
(Continued)

*Primary Examiner* — Nicole M Ippolito
(74) *Attorney, Agent, or Firm* — DiBerardino McGovern IP Group LLC

(57) ABSTRACT

An apparatus for supplying a target material includes a reservoir system, a priming system, and a transport system that extends from the priming system to the reservoir system. The reservoir system includes a reservoir in fluid communication with a nozzle supply system. The priming system includes a priming chamber defining a primary cavity; and a removable carrier configured to be received in the primary cavity. The removable carrier defines a secondary cavity configured to receive a solid matter that includes the target material. The transport system is configured to provide a fluid flow path between the priming system and the reservoir system.

29 Claims, 24 Drawing Sheets

(56) References Cited

U.S. PATENT DOCUMENTS

| | | |
|---|---|---|
| 7,122,816 B2 | 10/2006 | Algots et al. |
| 7,449,703 B2 | 11/2008 | Bykanov |
| 7,883,170 B2 | 2/2011 | Toyoda et al. |
| 8,654,309 B2 | 2/2014 | Kemper et al. |
| 8,872,126 B2 | 10/2014 | Umeda et al. |
| 9,029,813 B2 | 5/2015 | Fomenkov et al. |
| 9,176,393 B2 | 11/2015 | Cloin et al. |
| 9,307,625 B2 | 4/2016 | Rollinger et al. |
| 9,523,921 B2 | 12/2016 | Van Dijsseldonk et al. |
| 2006/0192155 A1 | 8/2006 | Algots et al. |
| 2008/0158309 A1 | 7/2008 | Toyoda et al. |
| 2011/0240890 A1 | 10/2011 | Govindaraju et al. |
| 2014/0151582 A1 | 6/2014 | Rollinger et al. |
| 2014/0239203 A1 | 8/2014 | Umeda et al. |
| 2016/0128170 A1 | 5/2016 | Rajyaguru et al. |
| 2022/0159817 A1* | 5/2022 | Govindaraju .......... H05G 2/008 |

FOREIGN PATENT DOCUMENTS

| | | |
|---|---|---|
| CN | 102472981 A | 5/2012 |
| WO | 2020187617 A1 | 9/2020 |

OTHER PUBLICATIONS

Christopher Smith, European International Searching Authority, International Search Report and Written Opinion, corresponding PCT Application No. PCT/US2019/057945, dated Feb. 27, 2020, 8 pages total.

Bob Rollinger, "Droplet Target for Laser-produced Plasma Light Sources," Dissertation ETH No. 20804, ETH Zurich (2012), 244 pages total.

\* cited by examiner

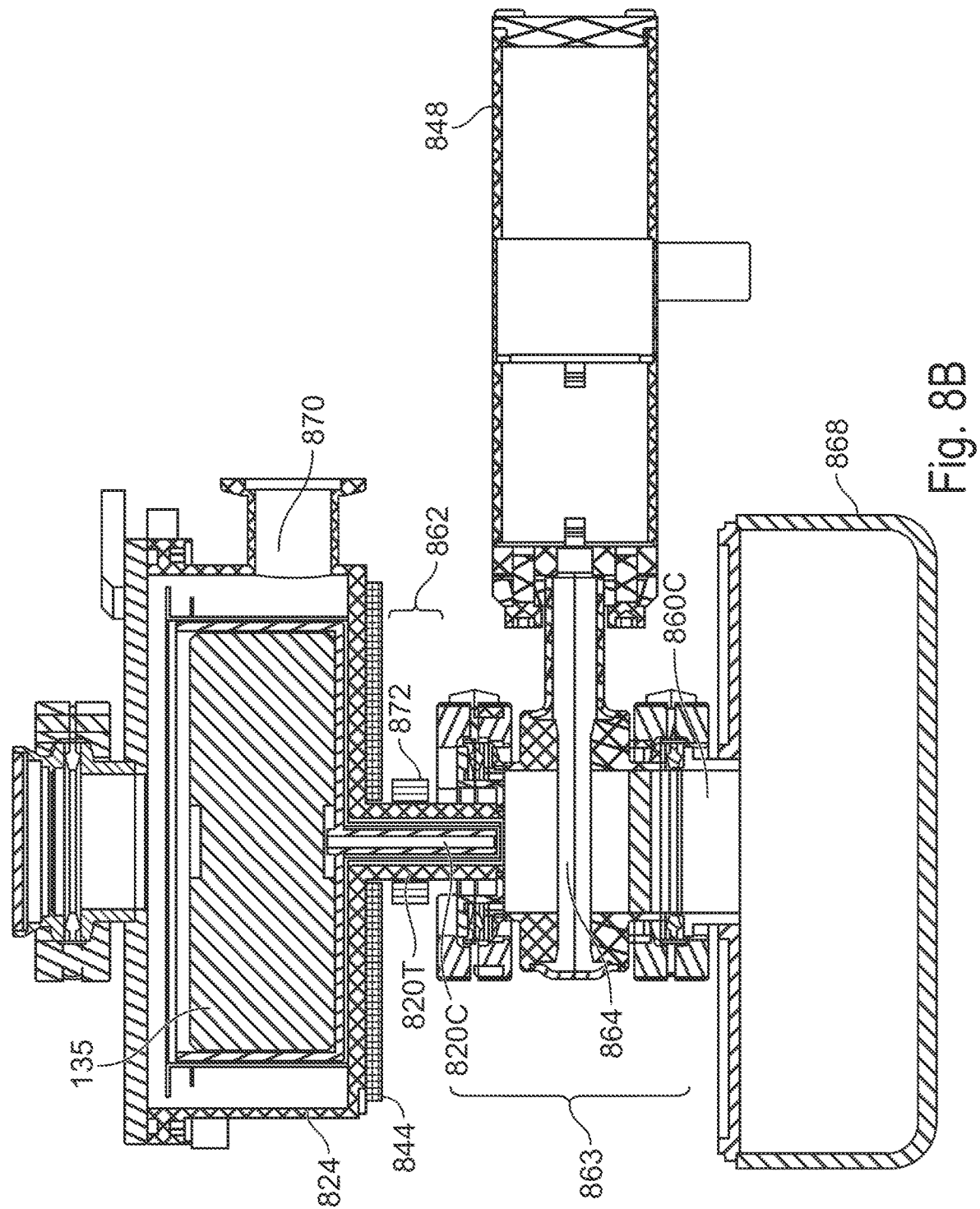

TARGET MATERIAL SUPPLY APPARATUS AND METHOD

CROSS REFERENCE TO RELATED APPLICATION

This application claims priority to U.S. Application No. 62/750,321, filed Oct. 25, 2018 and titled Target Material Supply Apparatus and Method, which is incorporated herein in its entirety by reference.

TECHNICAL FIELD

The disclosed subject matter relates to an apparatus and method for supplying a target material.

BACKGROUND

In semiconductor lithography (or photolithography), the fabrication of an integrated circuit (IC) requires a variety of physical and chemical processes performed on a semiconductor (for example, silicon) substrate (which is also referred to as a wafer). A lithography exposure apparatus (which is also referred to as a scanner) is a machine that applies a desired pattern onto a target region of the substrate. The substrate is fixed to a stage so that the substrate generally extends along an image plane defined by orthogonal $X_L$ and $Y_L$ directions of the scanner. The substrate is irradiated by a light beam, which has a wavelength in the ultraviolet range, somewhere between visible light and x-rays, and thus has a wavelength between about 10 nanometers (nm) to about 400 nm. Thus, the light beam can have a wavelength in the deep ultraviolet (DUV) range, for example, with a wavelength that can fall from about 100 nm to about 400 nm or a wavelength in the extreme ultraviolet (EUV) range, with a wavelength between about 10 nm and about 100 nm. These wavelength ranges are not exact, and there can be overlap between whether light is considered as being DUV or EUV.

EUV light is used in photolithography processes to produce extremely small features in substrates or silicon wafers. Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam. For this process, the plasma is typically produced in a sealed vessel, for example, a vacuum chamber, and monitored using various types of metrology equipment.

SUMMARY

In some general aspects, an apparatus for supplying a target material includes a reservoir system, a priming system, and a transport system. The reservoir system includes a reservoir in fluid communication with a nozzle supply system. The priming system includes:

a priming chamber defining a primary cavity; and a removable carrier configured to be received in the primary cavity. The removable carrier defines a secondary cavity configured to receive a solid matter that includes the target material. The transport system extends from the priming system to the reservoir system, and is configured to provide a fluid flow path between the priming system and the reservoir system.

Implementations can include one or more of the following features. For example, the removable carrier can include a lower wall configured to receive the solid matter, the lower wall defining a transport opening that, when the removable carrier is received in the primary cavity, is in fluid communication with the transport system. The lower wall can include a rim that extends above the lower wall into the secondary cavity, the rim defining the perimeter of the transport opening, wherein a plane of the lower wall is below a plane of the rim. In use, target material in the fluid state can be drained from the secondary cavity at least in part due to the transport system, and after the target material in the fluid state is drained, non-target material in the fluid state can be captured in a well that is defined by the rim and the lower wall and prevented from being drained from the secondary cavity.

The transport system can include a regulation apparatus configured to control a flow of fluid from the priming system. The priming system can include a tube wall that extends from the priming chamber. An interior of the tube wall is in fluid communication with the transport opening defined by the lower wall of the removable carrier and the fluid flow path of the transport system. The regulation apparatus can include a dual-valve assembly. The dual-valve assembly can include a freeze valve and a gate valve. The gate valve can be between the freeze valve and the reservoir system such that target material avoids contact with a gate of the gate valve. The freeze valve can include a regulation temperature adjusting device in thermal communication with the tube wall.

The transport system can include: a refill tank in the fluid flow path between the priming system and the reservoir system; and a regulation apparatus for controlling a flow of fluid between the priming system and the refill tank. The refill tank can define a refill cavity configured to receive the target material in the form of fluid matter from the priming system by way of the regulation apparatus. The priming chamber can be configured to be hermetically sealed with the removable carrier received in the primary cavity and the primary cavity can be configured to be pumped down to a primary pressure below atmospheric pressure in use. The refill tank can be configured to be hermetically sealed and the refill cavity can be configured to be pumped down to a refill pressure below atmospheric pressure in use. In use, the primary cavity can be in fluid communication with the refill cavity when the regulation apparatus is in an open state. The primary pressure can be less than or equal to about $10^{-6}$ Torr and the refill pressure is less than or equal to $10^{-6}$ Torr. The apparatus can also include a refill vacuum pump fluidly connected to the refill cavity and configured to adjust a refill pressure within the refill cavity.

The priming chamber can be configured to be hermetically sealed with the removable carrier received in the primary cavity. The apparatus can include a priming vacuum pump fluidly connected to the primary cavity by way of a valve system, and configured to adjust a primary pressure within the primary cavity.

The priming system can include a priming temperature adjusting device in thermal communication with the removable carrier such that a temperature in the secondary cavity is controlled by the priming temperature adjusting device.

In other general aspects, a method is performed for supplying a target material. The method includes inserting a solid matter that includes the target material into a secondary cavity of a removable carrier; inserting the removable carrier into a primary cavity of a priming chamber that is connected to a transport system that is in fluid communication with a reservoir system that comprises a reservoir in fluid communication with a nozzle supply system; maintaining a pressure in at least a portion of the transport system below atmospheric pressure; reducing a pressure in the primary cavity and the secondary cavity to below atmospheric pressure; opening a gate valve in the transport system; heating the inserted solid matter to a temperature above a melting point of the target material until the solid matter turns into fluid matter that includes the target material; preventing the fluid matter from flowing through the open gate valve until enough solid matter has been converted into fluid matter; and enabling the fluid matter to drain into the transport system portion and through the opened gate valve after it is determined that enough solid matter has been converted into fluid matter.

Implementations can include one or more of the following features. For example, the pressure in at least the portion of the transport system can be maintained below atmospheric pressure by maintaining the pressure in a refill tank of the transport system below atmospheric pressure, the refill tank being in fluid communication with the reservoir system by way of a refill valve system.

The gate valve in the transport system can be opened by opening the gate valve in the transport system when it is determined that the pressure in the primary cavity and the secondary cavity is substantially close to the pressure in the transport system portion. The pressure in the primary cavity and the secondary cavity can be determined to be substantially close to the pressure in the transport system portion by determining that the pressures are within $10^{-7}$ Torr of each other.

The priming chamber can be connected to the transport system extending between the removable carrier and the reservoir system by inserting a tube wall that extends from the priming chamber and defines an interior that is in fluid communication with a transport opening of the priming chamber into a regulation apparatus. The regulation apparatus can be configured to control a flow of fluid from the priming chamber. The priming chamber can be connected to the transport system extending between the removable carrier and the reservoir system by connecting the regulation apparatus to a refill tank that defines a refill cavity. The method can also include providing a fluid flow path between the refill cavity and the reservoir system and a fluid flow path between the regulation apparatus and the refill cavity. The priming chamber can be connected to the transport system extending between the removable carrier and the reservoir system by connecting the regulation apparatus to the reservoir system. The method can further include providing a fluid flow path between the regulation apparatus and the reservoir system.

The fluid matter can be enabled to drain into the transport system portion and through the opened gate valve by enabling fluid matter comprising target fluid matter to drain into the transport system portion and through the opened gate valve. The method can also include trapping non-target material in the removable carrier after the target fluid matter is drained from the removable carrier and into the transport system portion. The non-target material can have a density that is lower than a density of the target fluid matter.

The method can include, after the target fluid matter is drained into the transport system portion, then: closing the gate valve; enabling the pressure in the primary cavity to come up to atmospheric pressure; and removing the removable carrier from the primary cavity. The method can include disposing of the removed removable carrier. Removal of the removable carrier also removes the trapped non-target material.

The fluid matter can be enabled to drain into the transport system portion and through the opened gate valve after it is determined that enough solid matter has been converted into fluid matter by enabling the fluid matter to fall out of the secondary cavity of the removable carrier and into the transport system portion due to the force of gravity and without the use of a pressure differential between the secondary cavity and the transport system portion.

The fluid matter can be enabled to drain into the transport system portion and through the opened gate valve by avoiding contact between the fluid matter and a gate of the opened gate valve.

The pressure in at least the portion of the transport system can be maintained below atmospheric pressure by maintaining the pressure in at least the portion of the transport system at or below around $10^{-6}$ Torr.

The pressure in the primary cavity and the secondary cavity can be reduced to below atmospheric pressure by reducing the pressure in the primary cavity and the secondary cavity to a value that is close to the pressure in the portion of the transport system.

DESCRIPTION OF DRAWINGS

FIG. 8B is an assembled side cross-sectional view of the implementation of the priming system, the transport system, and the parameter control apparatus of FIG. 8A;

DETAILED DESCRIPTION

Figure 1:
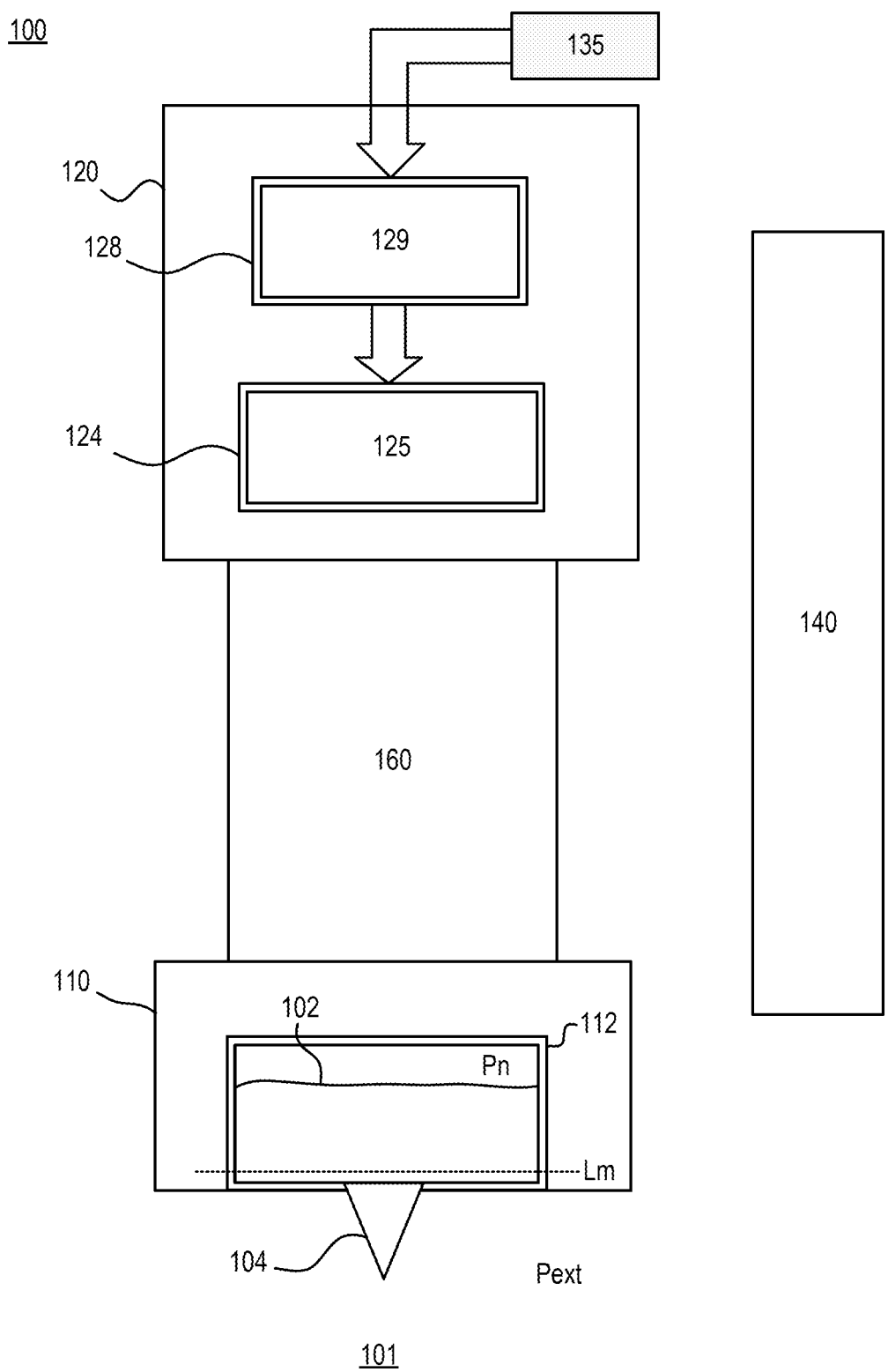
FIG. 1 is a block diagram of an apparatus configured to supply a target material, the apparatus including a reservoir system, a priming system configured to receive a solid matter, a transport system, and a parameter control apparatus.

Referring to FIG. 1, an apparatus 100 is configured for supplying a target material 102, such as tin (Sn), to a nozzle supply system 104. The apparatus 100 includes a reservoir system 110 that includes a reservoir 112 that holds the target material 102 and is in fluid communication with the nozzle supply system 104, which supplies the target material 102 to an external environment 101.

The apparatus 100 includes a priming system 120 having a priming chamber 124 that defines a primary cavity 125 and a removable carrier 128 that is configured to be received in the primary cavity 125. The removable carrier 128 defines a secondary cavity 129 that is configured to receive a solid matter 135 that includes the target material.

The apparatus 100 also includes a transport system 160 that extends between the priming system 120 and the reservoir system 110. The transport system 160 includes various fluid control devices that are configured to provide a controllable fluid flow path between the priming system 120 and the reservoir system 110. For example, the transport system 160 can include one or more valves, tubes, fluid flow regulation apparatuses, tanks for storing the target material 102, and environment control apparatuses, as discussed in greater detail below.

The apparatus 100 includes a parameter control apparatus 140 that is configured to control one or more parameters (such as a temperature and a pressure) at which the priming system 120 and the transport system 160 operate. The parameter control apparatus 140 includes one or more temperature control devices (such as heaters) for converting the solid matter 135 into a fluid material that includes the target material 102. The parameter control apparatus 140 includes one or more pressure control devices for controlling or altering pressures within the various cavities of the priming system 120 and the transport system 160.

In some implementations, the solid matter 135 is an ingot (such as a block or disk) made mostly of tin. The ingot can be at least 99% (or at least 99.9%) by weight pure. This means that there could be trace amounts of other non-tin material (such as lead and antimony) that could be present in the solid matter 135. In this example, in which the solid matter 135 is a tin ingot, the parameter control apparatus 140 includes a device or devices that heat the solid matter 135 to a temperature above 450° F. (which is the melting point of tin). When melted by a device of the parameter control apparatus 140, the solid tin turns into liquid tin and other non-tin material (such as the lead and antimony or molecules or other components). The non-tin material can be include one or more molecules, atoms, compounds, or other components, each of which is in the solid or liquid state, depending on the melting point of that component. The liquid tin (in this case, becomes the target material 102) is therefore supplied to the reservoir 112.

The reservoir 112 contains the target material 102 under a pressure (Pn) that is greater than atmospheric pressure. Because the target material 102 is in a molten or liquid state and is able to flow, and a pressure (Pext) of the external environment 101 is at or below atmospheric pressure, the molten or liquid target material 102 is, in operation, forced out of the nozzle supply system 104 due to the pressure differential between the pressure Pn in the reservoir 112 and the external pressure Pext. If the reservoir 112 requires additional target material 102, for example, because the level of target material 102 in the reservoir 112 drops below a minimum level (Lm), then the transport system 160 can supply the additional target material 102 (from the priming system 120) to the reservoir 112.

Because the carrier 128, which holds the solid matter 135, is removable from the priming chamber 124, it is straightforward to replace the solid matter 135 that includes the target material that is provided to the reservoir 112 by simply removing the used removable carrier 128 (in which target material has already been removed and supplied to the reservoir 112) from the secondary cavity 129 and inserting a new removable carrier 128 with a new solid matter 135. Additionally, the transport system 160 provides a mechanism that fluidly separates these replacement steps of the solid matter 135 from the operation of the reservoir 112. This means that the environment in the priming system 120 is separated from and is independent from the environment in the reservoir 112. In this way, the reservoir 112 can be maintained at the pressure Pn while being hermetically sealed and separated from the priming system 120. Because of this separation mechanism (which will be discussed herein), the reservoir 112 is not exposed to unwanted elements or matter (such as the non-target material) that may be present in the priming system 120 whenever the solid matter 135 needs to be refilled or replaced after all of the solid matter 135 in a prior removable carrier 128 has been spent (or used up). Such a design enables a continuous refill of the target material 102 to the reservoir 112 during operation of the reservoir system 110 without having to stop operation of the reservoir system 110.

Moreover, in some implementations as will be discussed with reference to FIGS. 7A-7C, the removable carrier 128 is designed to trap unwanted non-target material that can be present in the solid matter 135. Non-target material is any material that is not the target material. The removable carrier 128 traps most of the non-target material and prevents the trapped non-target material from flowing out of the priming system 120 and into the transport system 160. In this way, most of the unwanted non-target material is not fed into the reservoir 112 and the nozzle supply system 104 and therefore is not supplied to the external environment 101, where such unwanted non-target material can cause problems for devices or apparatuses that rely on a high purity of the target material 102 to operate efficiently. As discussed above, in one example, the solid matter 135 is a tin ingot that is 99.9% by weight pure. This means that there could be trace amounts of other non-tin material (such as lead and antimony) that could be present in or on the surface of the non-target material. Additionally, the tin that is present in the solid matter 135 can chemically interact with other elements (such as oxygen) that are inside the removable carrier 128 or the priming system 120 to form molecules of tin such as tin oxide (SnOx) that can coat the solid matter 125. The newly-designed removable carrier is configured to trap much of the non-tin material (which includes the tin oxide) and prevent it from flowing to the transport system 160 while allowing the tin to flow to the transport system 160 and to the reservoir system 110.

Figure 2:
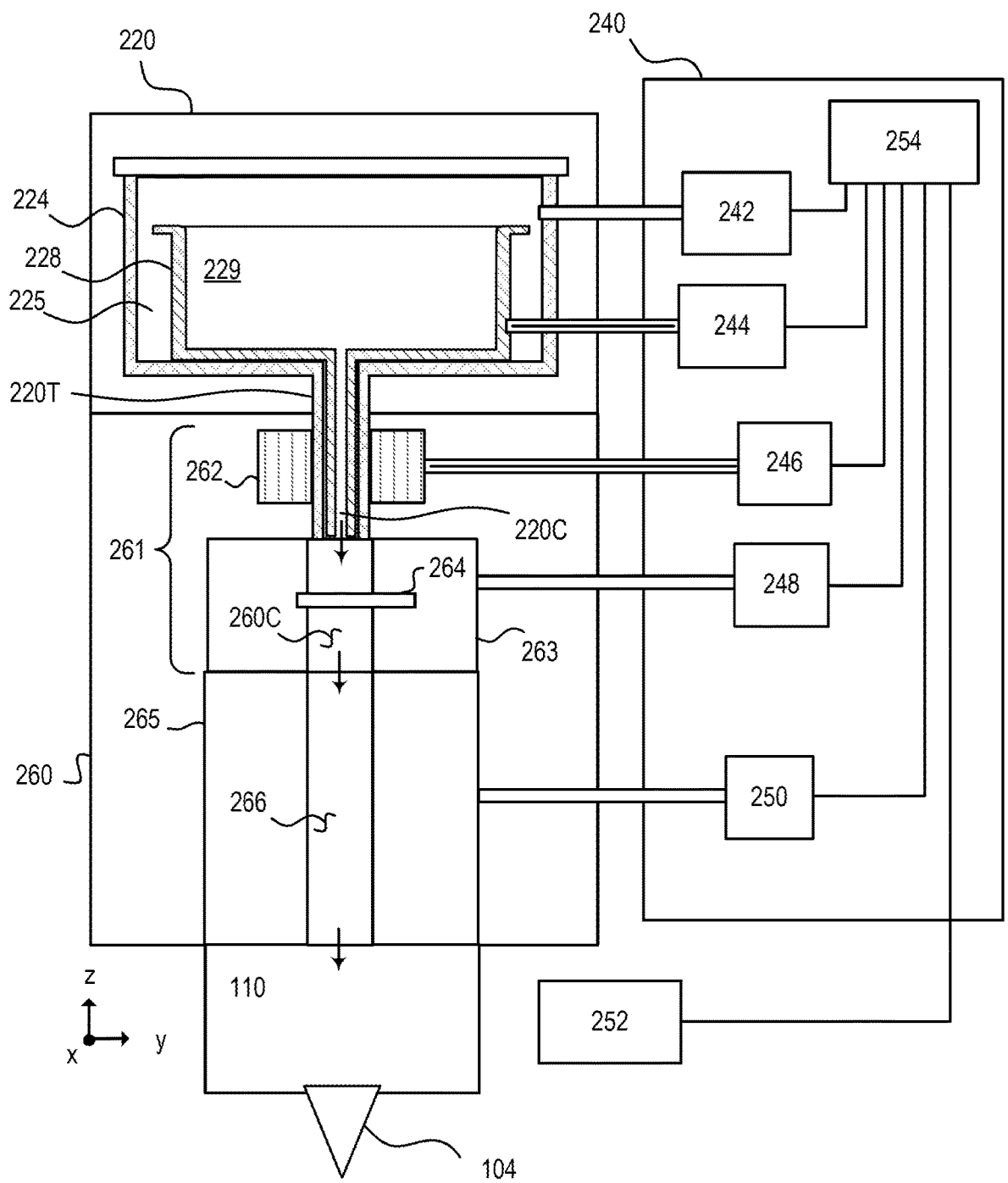
FIG. 2 is a block diagram of an implementation of the apparatus of FIG. 1, further including a sensor system and showing an implementation of the transport system.

Referring to FIG. 2, in some implementations, the apparatus 100 is implemented as an apparatus 200 that includes a priming system 220, a transport system 260, a sensor system 252, and a parameter control apparatus 240. The solid matter 135 is not shown in FIG. 2 but would be received within the priming system 220 during operation.

The priming system 220 includes a priming chamber 224 that receives the removable carrier 228 within its primary cavity 225. The solid matter 135 is received within the secondary cavity 229 of the removable carrier 228. The priming chamber 224 includes a removable lid 224L that serves as a mechanism to hermetically seal the primary cavity 225 and also to enable the removal of the removable carrier 228 when the solid matter 135 needs to be replaced. The priming system 220 includes a tube section 220T having a central fluid flow channel 220C that is a part of a fluid flow path between the priming system 220 and the transport system 260. The tube section 220T extends from the priming chamber 224 and the removable carrier 228, an interior of the tube section 220T is in fluid communication with a transport opening defined by the secondary cavity 229 and also is in fluid communication with a flow channel 260C of the transport system 260. Details and implementations relating to the priming system 220 are discussed below.

The transport system 260 includes a regulation apparatus 261 that controls a flow of fluid from the priming system 220. In this way, the regulation apparatus 261 controls the fluid flow path between the priming system 220 and the reservoir system 110. The regulation apparatus 261 includes a dual-valve assembly including a first valve arrangement 262 and a second valve arrangement 263 downstream of the first valve arrangement 262. The first valve arrangement 262 interacts with the central fluid flow channel 220C of the tube section 220T so that a flow of the target material 102 within the central fluid flow channel 220C is controlled by the operation of the first valve arrangement 262. The second valve arrangement 263 includes a valve 264 that interacts with the flow channel 260C of the transport system 260 so that the flow of the target material within the flow channel 260C is controlled by the operation of the second valve arrangement 263.

In some implementations, the first valve arrangement 262 includes a freeze valve. A freeze valve includes the tube section 220T and a regulation temperature adjusting device that is in thermal communication with the tube section 220T. The regulation temperature adjusting device is configured to change a temperature of the tube section 220T across a range of temperatures about a melting point of the solid matter 135. The regulation temperature adjusting device can be a cartridge heater in thermal communication with the tube section 220T. For example, if the temperature of the tube section 220T is kept substantially below the melting point of the solid matter 135, then any liquid that has flowed out of the carrier 228 (due to the force of gravity) would solidify as it reaches the central fluid flow channel 220C and this solid matter plugs the central fluid flow channel 220C to prevent further fluid from flowing through the central fluid flow channel 220C. The solid matter 135 can therefore be melted when the regulation temperature adjusting device heats the tube section 220T to a temperature above the melting point of the solid matter 135, and if the temperature is high enough (that is, exceeds this melting point), the solid matter 135 in the plug melts and freely flows through the central fluid flow channel 220C.

In certain implementations, the second valve arrangement 263 includes a gate valve, and the gate valve is placed between the freeze valve and the reservoir system 110. Because the second valve arrangement 263 is downstream of the freeze valve of the first valve arrangement 262, the gate valve should be opened prior to heating the tube section 220T so that melted liquid does not come in contact with the actual gate of the gate valve. Details and implementations relating to the regulation apparatus 261 are discussed below.

The transport system 260 can include other components 265 for interacting with a fluid flow path 266 between the regulation apparatus 261 and the reservoir system 110. The fluid flow path 266 extends between the flow channel 260C and the reservoir system 110. Details and implementations relating to the other components 265 are discussed below.

The sensor system 252 includes an arrangement of sensors that are configured to measure or sense various characteristics of the priming system 220, the transport system 260, and the reservoir system 110. Thus, in some implementations, the sensor system 252 includes one or more fluid sensors that are each configured to measure an amount of fluid remaining in a cavity within the fluid flow path from the priming system 220 to the reservoir system 110. For example, the sensor system 252 can include a height sensor that measures a height or amount of material inside the removable carrier 228 to determine when all of the material (except for the trapped non-target material) has drained from the removable carrier 228. As another example, the sensor system 252 can include a height sensor that measures an amount of target material 102 inside the reservoir 112 to determine when the level of target material 102 drops below the minimum level Lm.

Any components of the priming system 220 and the transport system 260 that come in contact with any fluid flow path or fluid cavity should be made of a material that is compatible with and non-reactive (at the relevant temperatures) to the solid matter 135, the target material 102, and any non-target material that can be present in the solid matter 135 and whether in solid or fluid or liquid form). For example, the priming chamber 224, the removable carrier 228, the regulation apparatus 261, and the other components 265 can be made of various rigid metals or metal alloys.

The parameter control apparatus 240 includes a set of control devices 242, 244, 246, 248, 250 in communication with various components within the priming system 220 and the transport system 260, and these control devices 242, 244, 246, 248, 250 are in communication with a controller 254. Communication between the devices 242, 244, 246, 248, 250 and the priming system 220 and the transport system 260 and communication between the devices 242, 244, 246, 248, 250 and the controller 254 can be electronic (and either wired or wireless), thermal-based, or fluid based, depending on the control.

The control device 242 is a pressure control device 242 fluidly connected to the primary cavity 225 (and the secondary cavity 229) so as to control a pressure within the primary cavity 225 and the secondary cavity 229. The pressure control device 242 can be configured to reduce the pressure within the primary cavity and the secondary cavity 229 to a high vacuum pressure (which can be as low as $10^{-7}$ Torr or on the order of $10^{-6}$ Torr) and to maintain that high vacuum pressure during operation. The pressure control device 242 therefore includes a priming vacuum pump and valve system that are suitable for obtaining a high vacuum pressure. For example, the priming vacuum pump can be a turbomolecular pump, a vapor diffusion pump, a cryopump, a sputter ion pump, or a scroll pump. The valve system can include a gate valve.

The control device 244 is a temperature control device 244 thermally connected to the removable carrier 228 so as to control a temperature of the removable carrier 228, a temperature of the secondary cavity 229, and a temperature of the solid matter 135 (when the solid matter 135 is within the secondary cavity 229). The temperature control device 244 can operate to change the temperature of the solid matter 135 between a temperature above the melting point of the target material 102 to a temperature below the melting point of the target material 102. The temperature control device 244 can include a device that imparts heat or energy to the secondary cavity 229 to thereby heat the solid matter 135. For example, if the solid matter 135 is made of tin, which has a melting point of about 450° F., then the temperature control device 244 can include a resistance heater that heats up upon application of a current through the wire. For example, the temperature control device 244 can be a cartridge or insertion heater.

As another example, the temperature control device 244 can operate based on vacuum induction melting that utilizes electric currents to melt the tin while it is under the high vacuum pressure. In such a design, the temperature control device 244 includes an electrical conductor placed in relation to the removable carrier 228 and a current can be induced within the conductor through electromagnetic induction. Induced current creates a heating effect, which can melt the tin.

The control device 246 is a fluid control device that is in communication with the first valve arrangement 262. The fluid control device 246 actuates or adjusts aspects of the first valve arrangement 262 to thereby control the flow (for example, the flow rate) of fluid through the central fluid flow channel 220C. Similarly, the control device 248 is a fluid control device that is in communication with the second valve arrangement 263. The fluid control device 248 actuates or adjusts aspects of the second valve arrangement 263 to thereby control the flow (for example, the flow rate) of fluid through the flow channel 260C. Examples of the fluid control devices 246, 248 are discussed below.

The control device 250 includes one or more sub-devices and is configured to control physical parameters related to the other components 265 or to the fluid flow path 266 between the regulation apparatus 261 and the reservoir system 110. Examples of the control device 250 are discussed below.

The controller 254 is in communication with each of the control devices 242, 244, 246, 248, 250. The controller 254 is in communication with the sensor system 252 to receive the information relating to characteristics of the priming system 220, the transport system 260, and/or the reservoir system 110. The controller 254 can determine what signals should be provided to one or more of the control devices 242, 244, 246, 248, 250 based on an analysis of the received information.

Moreover, the controller 254 can be in communication with other components of the external environment 101. For example, the controller 254 can receive data or information from the other components of the external environment 101.

The controller 254 can interface with a user to receive input from an operator or user or to output data or information to the user. For example, the controller 254 can also include one or more input devices (such as a keyboard, touch screen, microphone, mouse, hand-held input device, etc.) and one or more output devices (such as a speaker or a monitor).

The controller 254 can include one or more of digital electronic circuitry, computer hardware, firmware, and software. The controller 254 can include memory, which can be read-only memory and/or random-access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The controller 254 can include one or more programmable processors, and one or more computer program products tangibly embodied in a machine-readable storage device for execution by a programmable processor. The one or more programmable processors can each execute a program of instructions to perform desired functions by operating on input data and generating appropriate output. Generally, the processor receives instructions and data from memory. Any of the foregoing may be supplemented by, or incorporated in, specially designed ASICs (application-specific integrated circuits).

The controller 254 can include a set of modules, with each module including a set of computer program products executed by one or more processors such as the processors. Moreover, any of the modules can access data stored within the memory. Each module can receive data from other components and then analyze such data as needed. Each module can be in communication with one or more other modules. Each module can be dedicated to a particular control device 242, 244, 246, 248, 250.

Although the controller 254 is represented as a box (in which all of its components can be co-located), it is possible for the controller 254 to be made up of components that are physically remote from each other. For example, a particular module can be physically co-located with the control device or a particular module can be physically co-located with another component.

Figure 3:
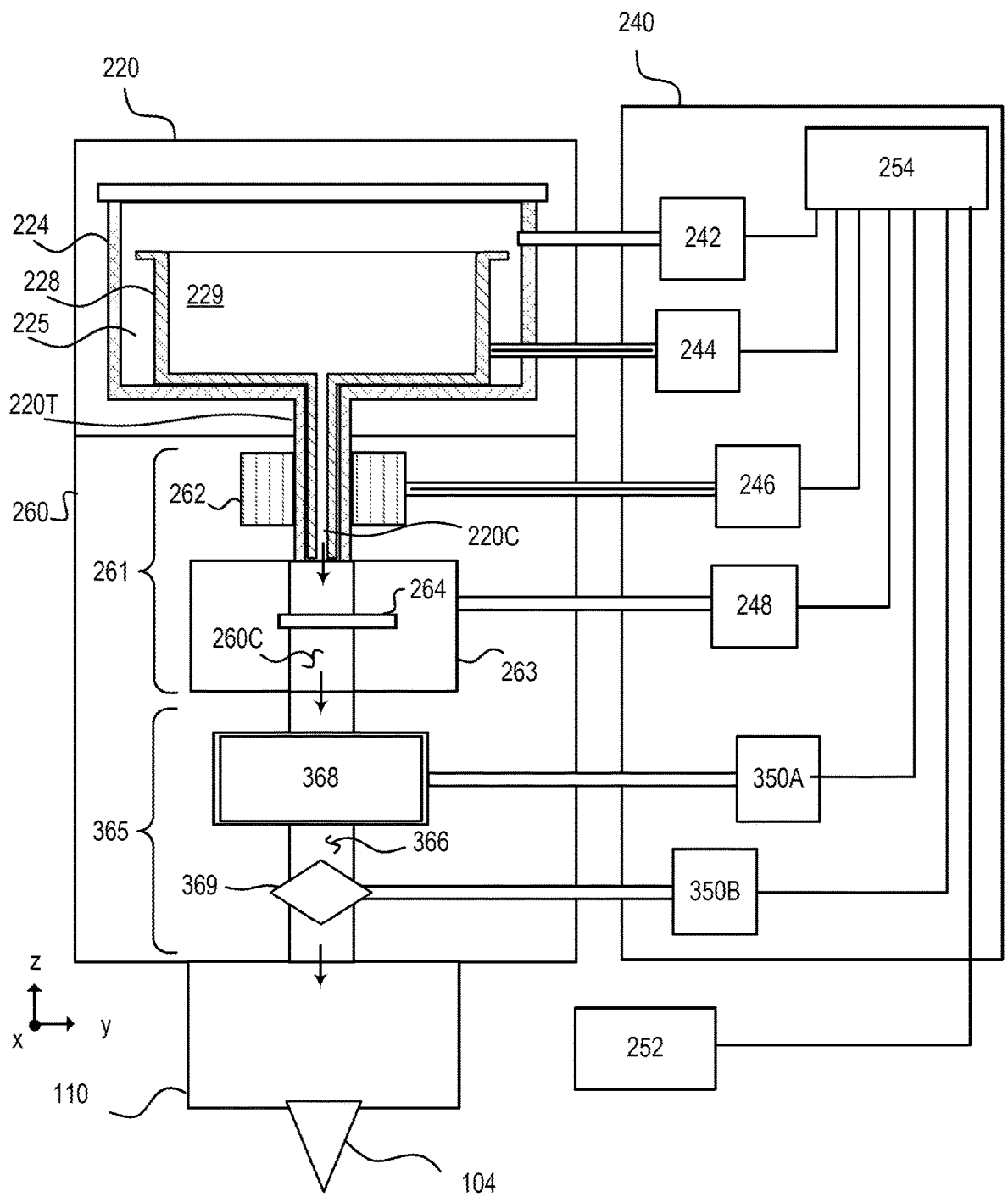
FIG. 3 is a block diagram of an implementation of the apparatus of FIG. 1, further including a sensor system and showing an implementation of the transport system including a refill tank.

Referring to FIG. 3, in some implementations, the other components 365 of the transport system 360 include a refill tank 368 that is in fluid communication with the regulation apparatus 261 (and is just downstream of the second valve arrangement 263). The refill tank 368 provides a controlled environment to store the target material 102 for use by the reservoir system 110 under control of a valve arrangement 369 in a fluid flow path 366 between the refill tank 368 and the reservoir system 110. A pressure in the cavity of the refill tank 368 can be controlled with a pressure control device 350i that is in communication with the controller 354. Moreover, a fluid flow from the refill tank 368 can be controlled with a valve arrangement 369 that is controlled by a valve control device 350ii that is in communication with the controller 354. Thus, when the controller 254 determines that the reservoir system 110 requires additional target material 102, for example, if the level of the target material 102 in the reservoir drops below the minimum level Lm (as provided by the sensor system 252), then the controller 254 instructs the control device 350ii to send a signal to the valve arrangement 369 to open the fluid flow path between the refill tank 368 and the reservoir system 110. The opening of the fluid flow path enables the supply of the target material 102 from the refill tank 368 to the reservoir 112.

Next, an implementation of a priming system 420 is described with reference to FIGS. 4A and 4B. The priming system 420 includes a priming chamber 424, which, in this implementation, is cylindrically shaped such that the axis of the cylinder extends along a z axis and the circular cross section extending in the x-y plane. The priming chamber 424 includes a side wall 424W (or walls if having a shape other than a cylindrical shape), a base 424B from which the side wall 424W extends, the base 424B extending in the x-y plane, and a lid 424L that is shaped to fit over the side wall 424W. The lid 424L extends along the x-y plane when attached to the side wall 424W. The side wall 424W, the base 424B, and the lid 424L, in combination, define the primary cavity 425. The seal between the lid 424L and the side wall 424W is a hermetic (or airtight) seal. The lid 424L is removable to enable the removable carrier 428 to be inserted and removed from the primary cavity 425. The priming system 420 includes a tube wall 424T that extends along the z axis from the base 424B toward and into the transport system 260. The tube wall 424T defines an interior channel 424C that is fluidly open to the primary cavity 425 at one end and is fluidly open to the transport system 260 at its other end.

The priming system 420 includes the removable carrier 428 that can be received in the primary cavity 425 of the priming chamber 424. In this implementation, the removable carrier 428 is cylindrically-shaped to match the shape of the priming chamber 424 such that the axis of the cylinder extends along the z axis and coincides with the axis of the priming chamber 424, and the circular cross section of the carrier 428 extends in the x-y plane. The removable carrier 428 includes a side wall 428W and a base 428B from which the side wall 428W extends, the base 428B extending generally in the x-y plane. The side wall 428W and the base 428B define the open secondary cavity 429. The removable carrier 428 includes a tube wall 428T that extends from the base 428B toward and into the interior channel 424C of the tube wall 424T of the priming chamber 424. The tube wall 428T defines an interior channel 428C that is fluidly open to the secondary cavity 429 at one end and is fluidly open to the transport system 260 at its other end. The interior channel 428C corresponds to the central fluid flow channel 220C that provides a fluid transport opening for the fluid material that includes the target material 102.

Figure 4B:
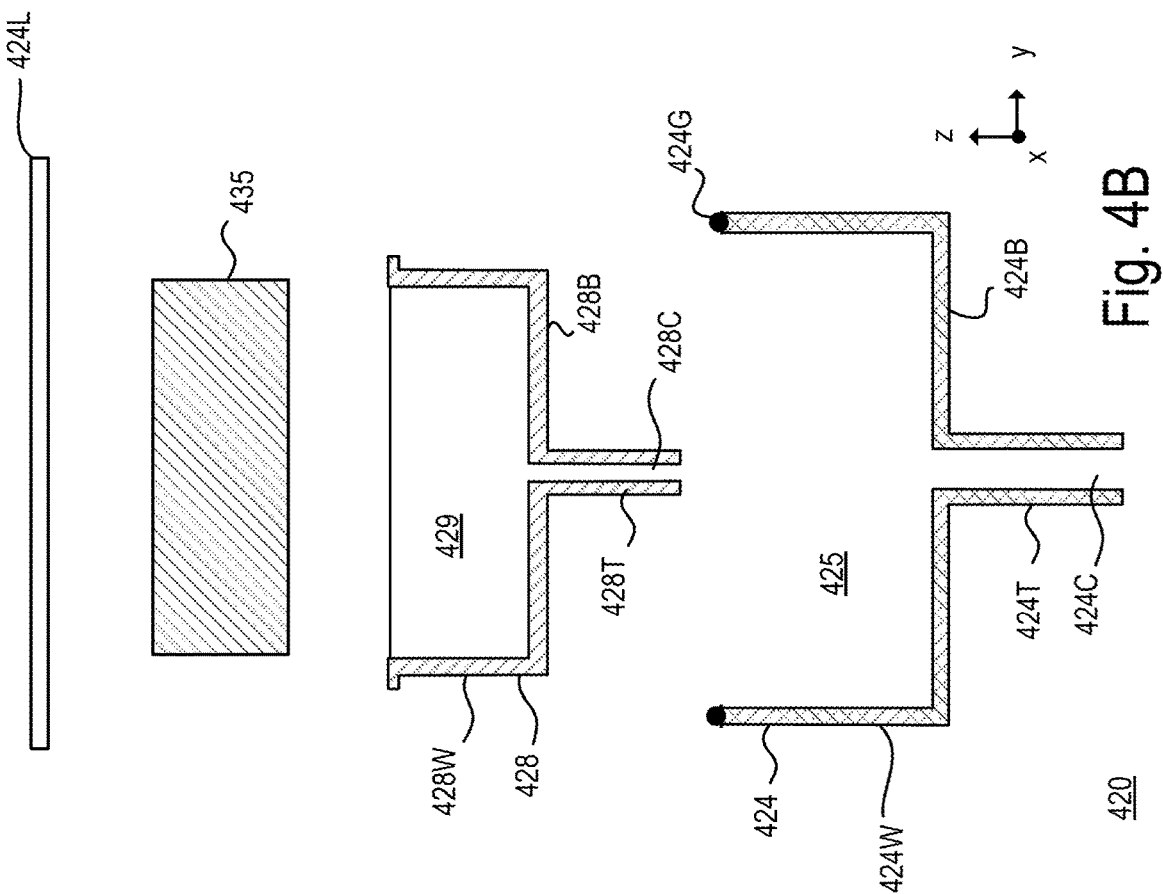
FIG. 4B is an exploded cross-sectional view of the implementation of the priming system of FIG. 4A.
Figure 4A:
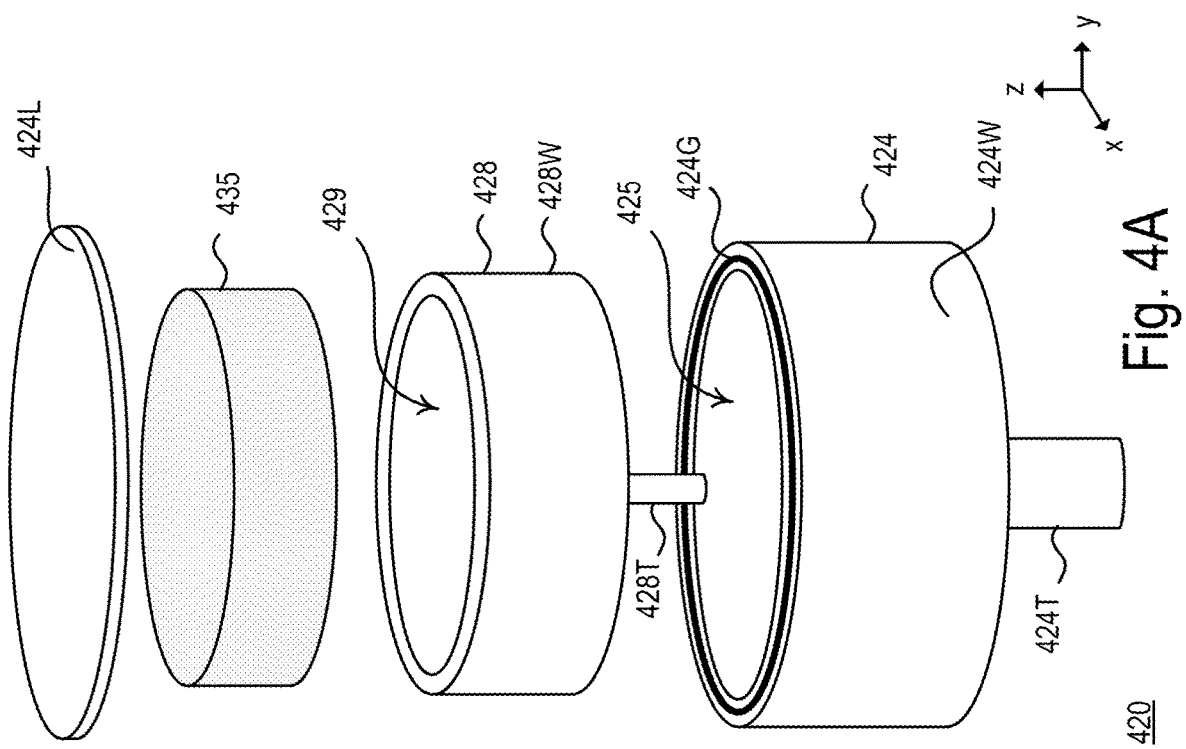
FIG. 4A is an exploded perspective view of an implementation of a priming system that includes a cylindrically-shaped priming chamber and a cylindrically-shaped removable carrier configured to be inserted and removed from a primary cavity of the priming chamber.

Other than the solid matter 435 (which is not a part of the priming system 420, but is shown in FIGS. 4A and 4B for context), the components of the priming system 420 can be made of a suitable rigid, non-reactive material such as a metal or metal alloy such as stainless steel.

As mentioned, the priming chamber 424 is configured to be hermetically sealed at the interface between the lid 424L and the wall 424W after the removable carrier 428 is received in the primary cavity 425. The hermetic seal is any type of sealing that makes the interface airtight (such that it excludes the passage of air, oxygen, or other gases). The sealing mechanism can be, for example, a mechanical gasket seal such as an O-ring seal. Thus, a groove can be formed in the side wall 424W that receives a gasket 424G and after the removable carrier 428 is inserted into the primary cavity 425, the lid 424L is placed on the side wall 424W such that the gasket 424G is pressed (under pressure, as discussed in detail below). The material of the gasket 424G can be suitable for the pressure at which the cavity 425 and 429 is to be held.

Figure 5A:
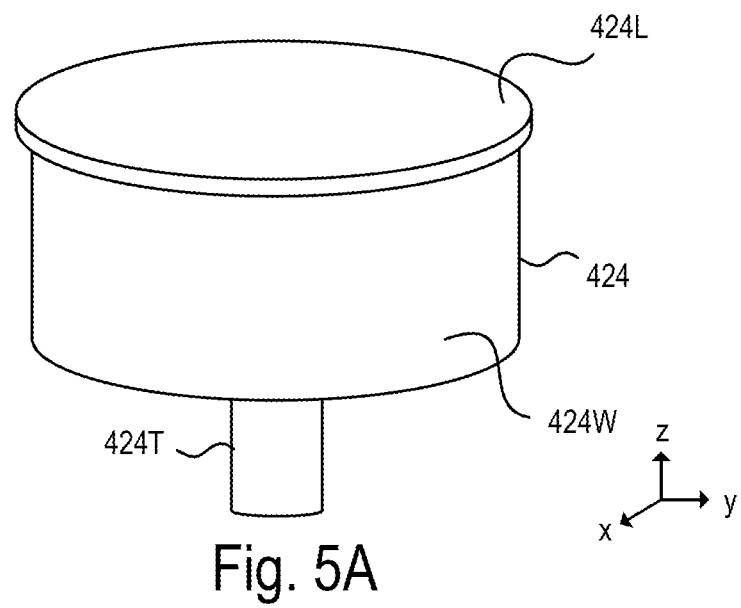
FIG. 5A is a perspective view of the implementation of the priming system of FIG. 4A in an assembled state.
Figure 5B:
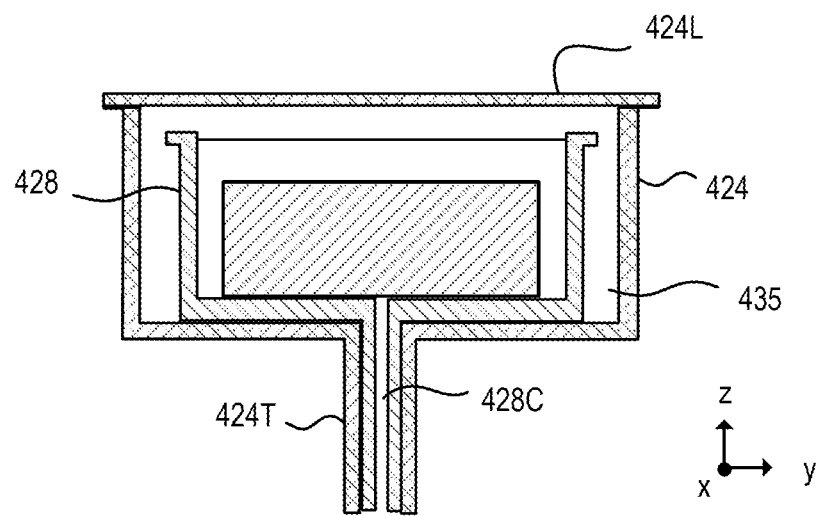
FIG. 5B is a cross-sectional view of the implementation of the priming system of FIG. 5A in an assembled state.

As shown in FIGS. 5A and 5B, in use, the solid matter 435 is inserted along the z axis into the secondary cavity 429, which is defined by the side wall 428W and the base 428B (as shown in FIGS. 4A and 4B, the removable carrier 428 is inserted along the z axis into the primary cavity 425 defined by the side wall 424W and the base 424B, and the lid 424L is placed on the side wall 424W of the priming chamber 424.

Figure 6A:
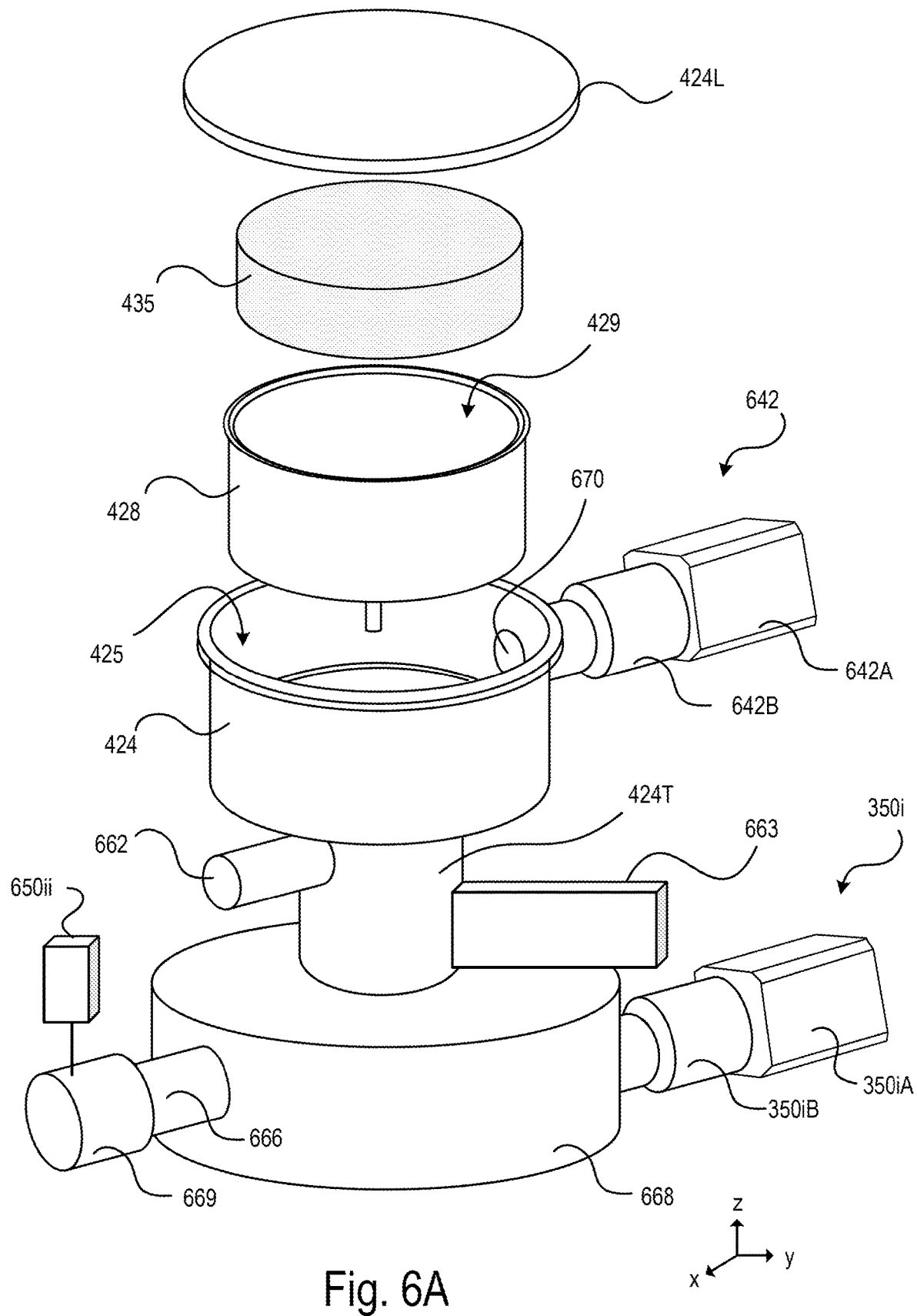
FIG. 6A is an exploded perspective view of the implementation of the priming system of FIG. 4A, including an implementation of a transport system and a parameter control apparatus.
Figure 6B:
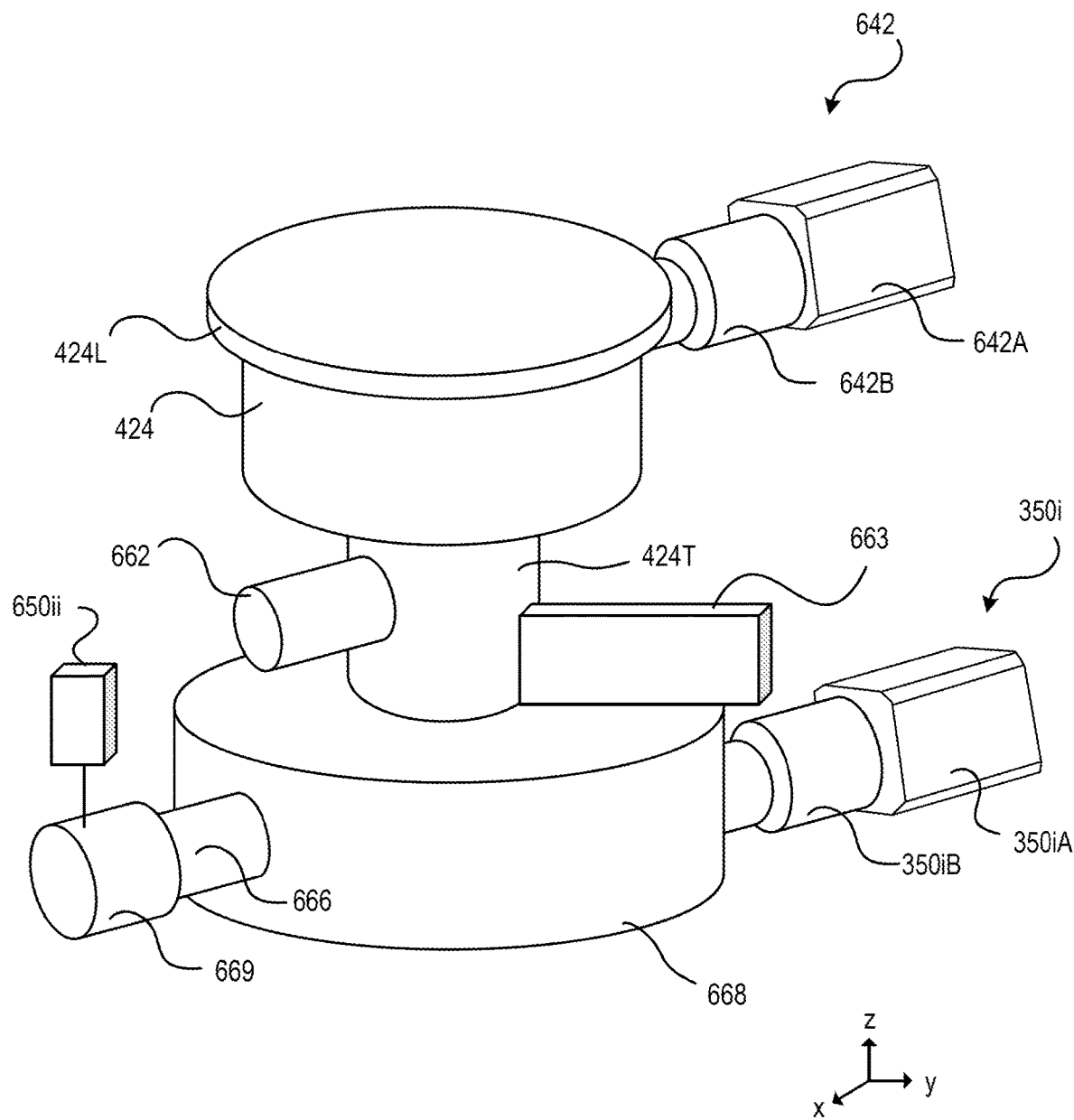
FIG. 6B is an assembled perspective view of the implementation of the priming system, transport system, and parameter control apparatus of FIG. 6A.

Referring to FIGS. 6A and 6B, the side wall 424W of the priming chamber 424 is fitted with (or includes) a port 670 in fluid communication with a pressure control device 642 of the parameter control apparatus 240. The pressure control device 642 includes a priming vacuum pump 642A and a valve system 642B in the flow path between the priming chamber 424 and the pump 642A. The priming vacuum pump 642A is configured (under control of the controller 254 in the parameter control apparatus 240) to adjust a primary pressure of the primary cavity 425 and also of the secondary cavity 429. The priming vacuum pump 642A can be a vacuum pump that is suitable for obtaining a high vacuum pressure (that is, as low as $10^{-7}$ Torr and on the order of $10^{-6}$ Torr) in the primary cavity 425. For example, the priming vacuum pump 642A can be a turbomolecular pump, a vapor diffusion pump, a cryopump, or a sputter ion pump.

Additionally, the pressure control device 642 can include additional pumps such as backing pumps (for rough and low vacuum pressure ranges) and booster pumps (for rough and low vacuum pressure ranges) to supplement the functioning of the priming vacuum pump 642A.

The tube wall 424T interfaces with the regulation apparatus 261, which includes a first valve arrangement 662 and a second valve arrangement 663 downstream of the first valve arrangement 662. The refill tank 668 is configured with a port for providing a flow path to the pressure control device 650i that is in communication with the controller 354. The pressure control device 650i includes a refill vacuum pump 650iA and a valve system 650iB in the flow path between the refill tank 668 and the refill vacuum pump 650iA. The refill vacuum pump 650iA is configured (under control of the controller 254 in the parameter control apparatus 240) to adjust a pressure of the cavity within the refill tank 668. The refill vacuum pump 650iA can be a vacuum pump that is suitable for obtaining a high vacuum pressure (that is, as low as $10^{-7}$ Torr and on the order of $10^{-6}$ Torr) in the cavity of the refill tank 668. For example, the refill vacuum pump 650iA can be a turbomolecular pump, a vapor diffusion pump, a cryopump, or a sputter ion pump.

The fluid flow from the refill tank 668 along the fluid flow path 666 is controlled with the valve arrangement 669 that is controlled by the valve control device 650ii.

Figure 7A:
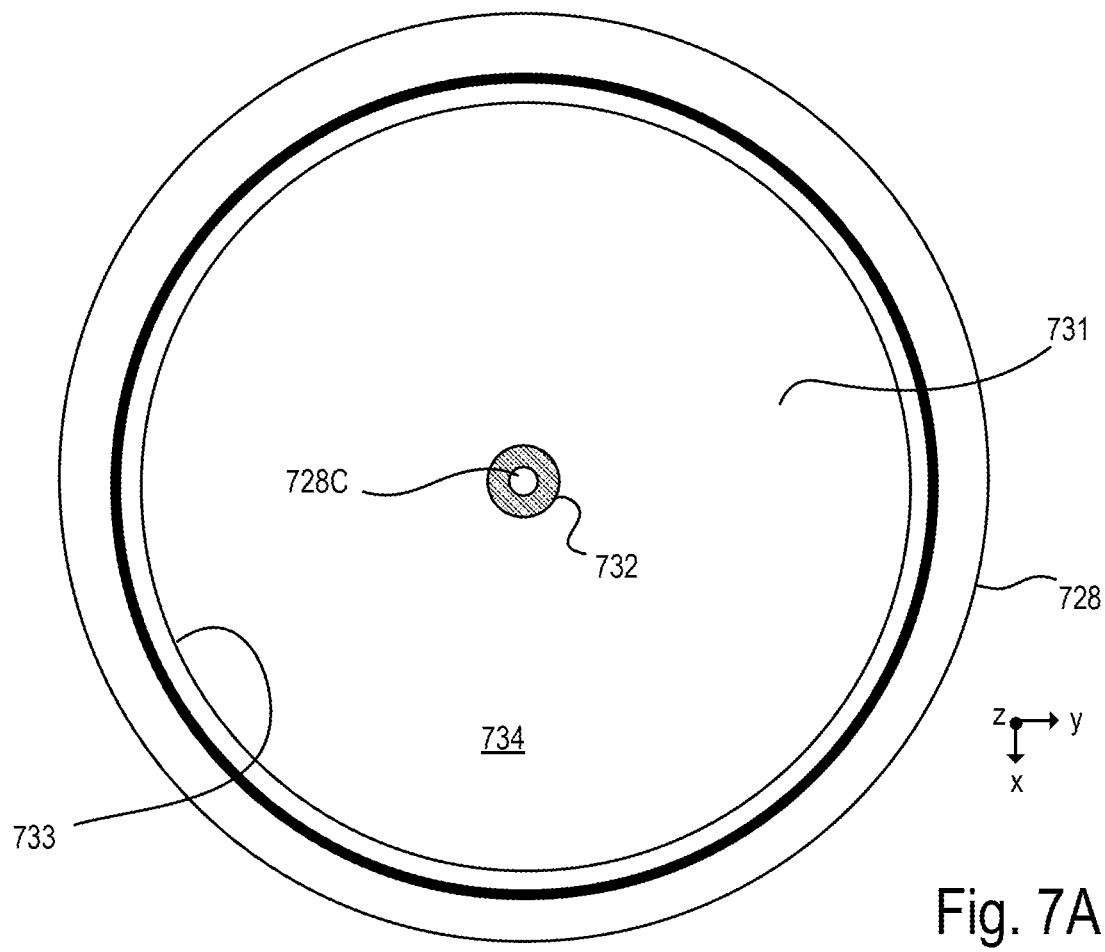
FIG. 7A is a top view of an implementation of the removable carrier of FIG. 1 that is designed to trap unwanted non-target material that can be present in the solid matter.
Figure 7B:
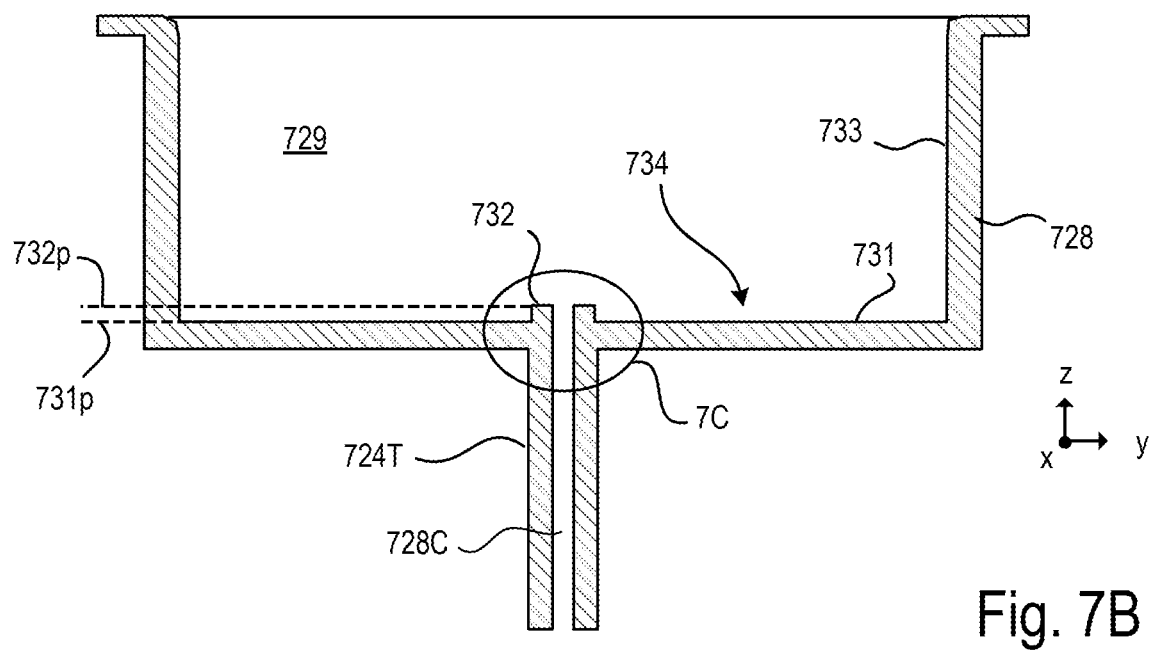
FIG. 7B is a side cross-sectional view of the implementation of the removable carrier of FIG. 7A.
Figure 7C:
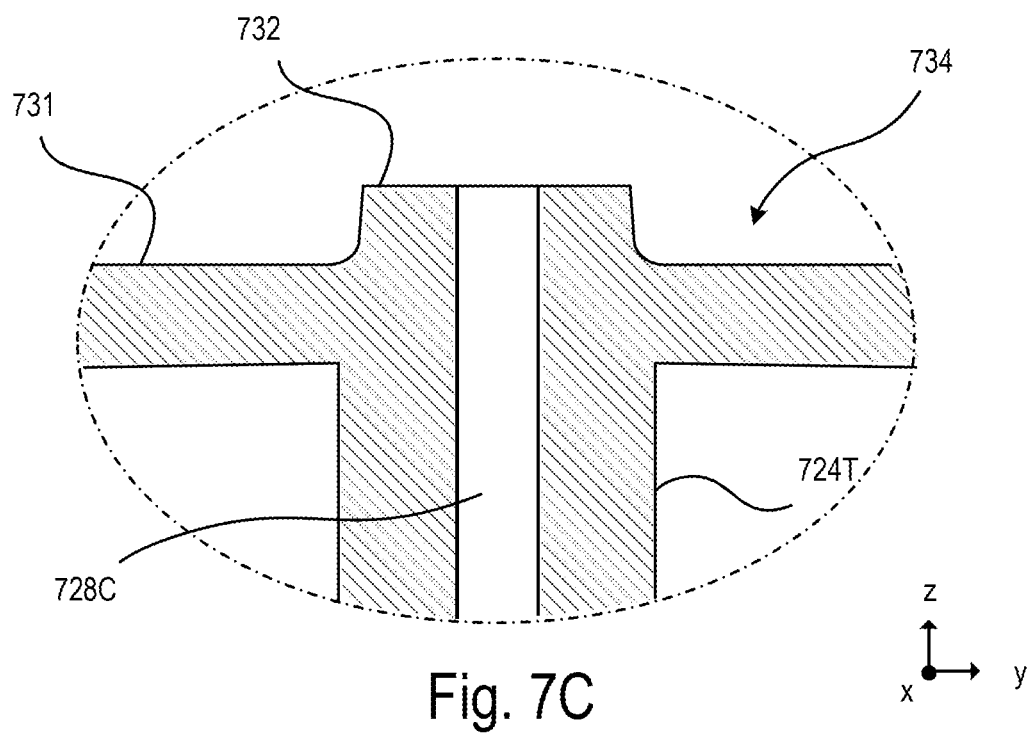
FIG. 7C is a side cross-sectional view of portion 7C of the removable carrier of FIG. 7B.

Referring to FIGS. 7A-7C, in some implementations, as mentioned above, the removable carrier 228 is configured as a removable carrier 728, which traps the non-target material that can be present in the solid matter 435. The newly-designed removable carrier 728 greatly reduces the amount of the trapped non-target material that flows out of the priming system 120, 220 and into the transport system 160. The removable carrier 728 operates by physically separating melted non-target material that has a different density than the melted target material 102. For example, as discussed above, in one example, the solid matter 435 is a tin ingot that is 99.9% by weight pure. Tin oxide can be present in the tin ingot, and tin oxide is less dense than pure tin. The removable carrier 728 has a geometry that is able to separate the tin oxide from the pure tin.

Specifically, the base 728B of the carrier 728 is configured to receive the solid matter 435. In this implementation, the base 728B includes a lower wall 731 extending along the x-y plane and facing the secondary cavity 729 and configured to receive or provide a platform for the solid matter 435. The lower wall 731 defines the interior channel 728C that, when the removable carrier 728 is received in the primary cavity 425, is in fluid communication with the transport system 160. The lower wall 731 includes a rim 732 that extends or protrudes up along the z axis above the lower wall 731 and into the secondary cavity 729. The rim 732 is a raised ledge that defines the perimeter of the transport opening into the interior channel 728C. A plane 731p that defines the ledge of the lower wall 731 is parallel with the x-y plane and is offset along the z axis from a plane 732p that defines the rim 732.

The volume defined by the lower wall 731, the rim 732, and the interior vertical wall 733 acts as a well 734 in which this less-dense non-target material can pool or accumulate as the target material 102 passes through the interior channel 728C due to the weight of gravity. This happens because the less-dense non-target material floats to the top of the secondary cavity 729. The well 734 is configured to permit only a small amount of the less-dense non-target material to reach the interior channel 728C. For example, only the amount of less-dense non-target material that melts above or remains above the transport opening flows into the interior channel 728C, while the remaining less-dense non-target material pools over the lower wall 731 in the well 734 after the target material 102 (in liquid form) has passed through the interior channel 728C.

Figure 8A:
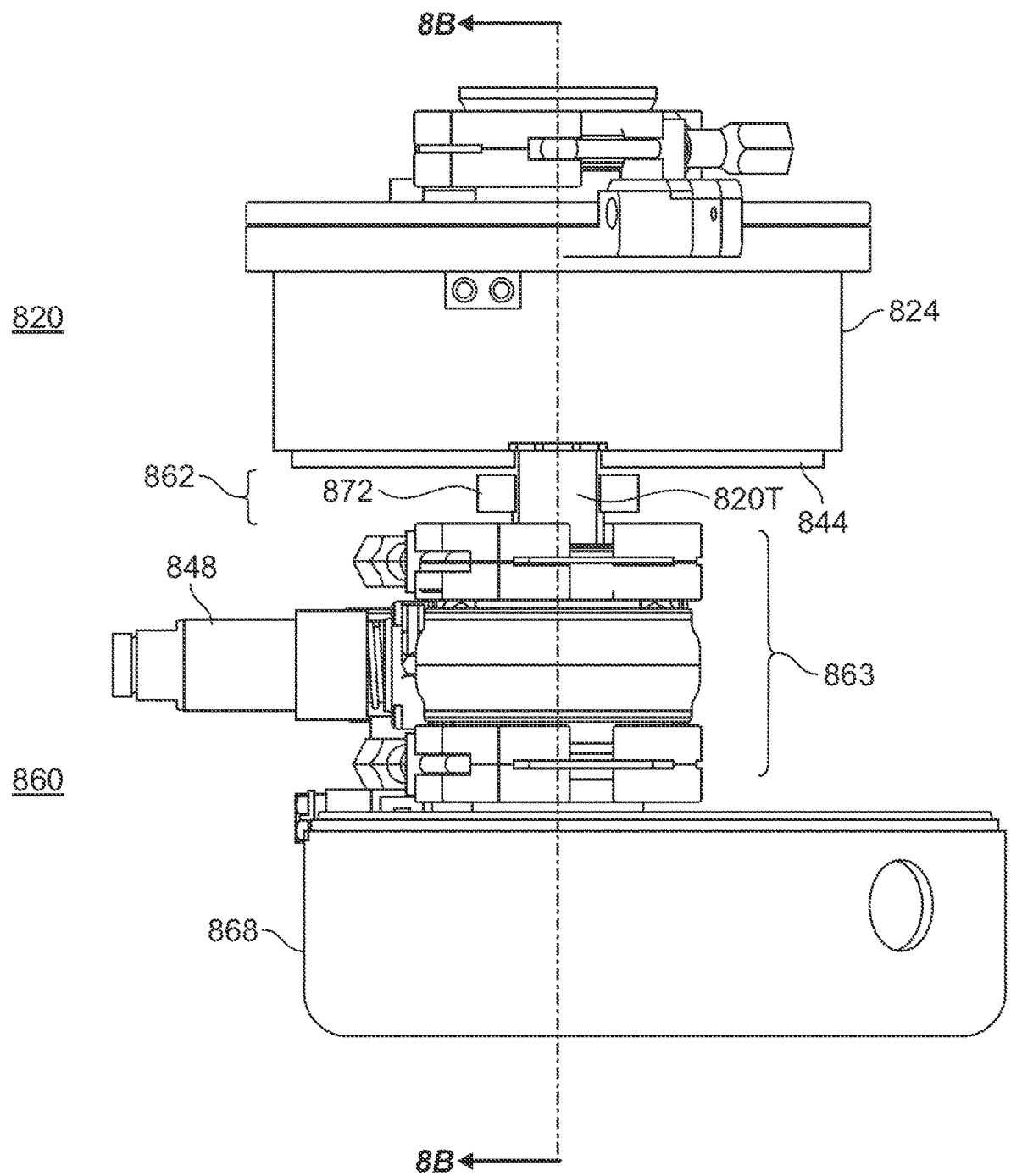
FIG. 8A is an assembled side view of an implementation of the priming system, the transport system, and the parameter control apparatus.

Referring to FIGS. 8A and 8B, in some implementations, the priming system 220 and the transport system 260 are designed as a priming system 820 and a transport system 860. In this implementation, the regulation apparatus 261 is designed as a regulation apparatus 861 and the temperature control device 244 is designed as a heater 844 that is thermally connected to the removable carrier 828. The heater 844 is a resistance heater (such as a cartridge or insertion heater) in contact with the removable carrier 828.

As discussed above, the regulation apparatus 861 controls a flow of fluid from the priming system 820. The regulation apparatus 861 includes as the first valve arrangement 262 a freeze valve 862. The freeze valve 862 includes the tube section 820T and a regulation temperature adjusting device 872 that is in thermal communication with the tube section 820T. The regulation temperature adjusting device 872 is configured to change a temperature of the tube section 820T across a range of temperatures about a melting point of the solid matter 135. In this implementation, the regulation temperature adjusting device 872 is a cartridge heater in thermal communication with the tube section 820T. If the temperature of the tube section 820T is kept substantially below the melting point of the solid matter 135, then any liquid that has flowed out of the carrier 828 (due to the force of gravity) solidifies as it reaches the central fluid flow channel 820C and this solid matter plugs the central fluid flow channel 820C to prevent further fluid from flowing through the central fluid flow channel 820C. The solid matter 135 can therefore be melted when the regulation temperature adjusting device 872 heats the tube section 820T to a temperature above the melting point of the solid matter 135, and if the temperature is high enough (that is, exceeds the melting point of the solid matter 135), the solid matter 135 in the plug melts and freely flows through the central fluid flow channel 820C.

The regulation apparatus 861 includes as the second valve arrangement 263 a gate valve arrangement 863. The gate valve arrangement 863 includes a gate (or valve) 864 that interacts with the flow channel 860C of the transport system 860 so that the flow of the target material within the flow channel 860C is controlled by the operation of the second valve arrangement 863. Because the second valve arrangement 863 is downstream of the freeze valve 862, the gate 864 should be opened prior to the freeze valve 862 heating the tube section 820T so that melted liquid does not come in contact with the gate 864.

Figure 9:
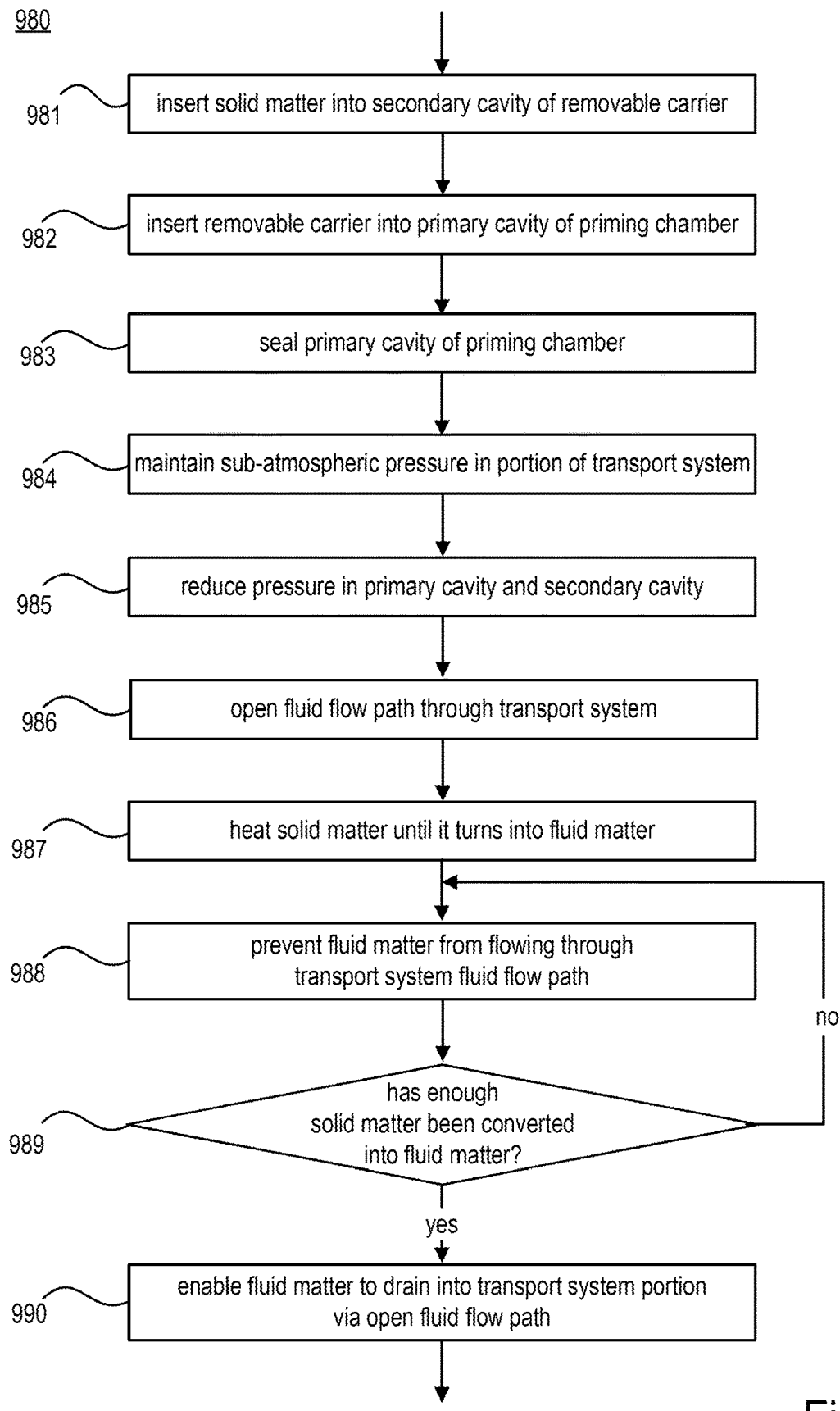
FIG. 9 is a flow chart of an exemplary procedure performed by the apparatus of FIG. 1 for supplying the target material to an external environment.

Next, as shown in FIG. 9, a procedure 980 is performed by the apparatus 100 for supplying the target material 102 to the external environment 101. Additional reference is made to FIGS. 10A-10I when discussing the steps of the procedure 980. FIGS. 10A-10I depict the relevant components of an implementation of the apparatus 100 through the various steps in the procedure 980. Initially, as shown in FIG. 10A, the solid matter 1035, which includes the target material, is placed into the secondary cavity 1029 of the removable carrier 1028 (981).

Figure 10B:
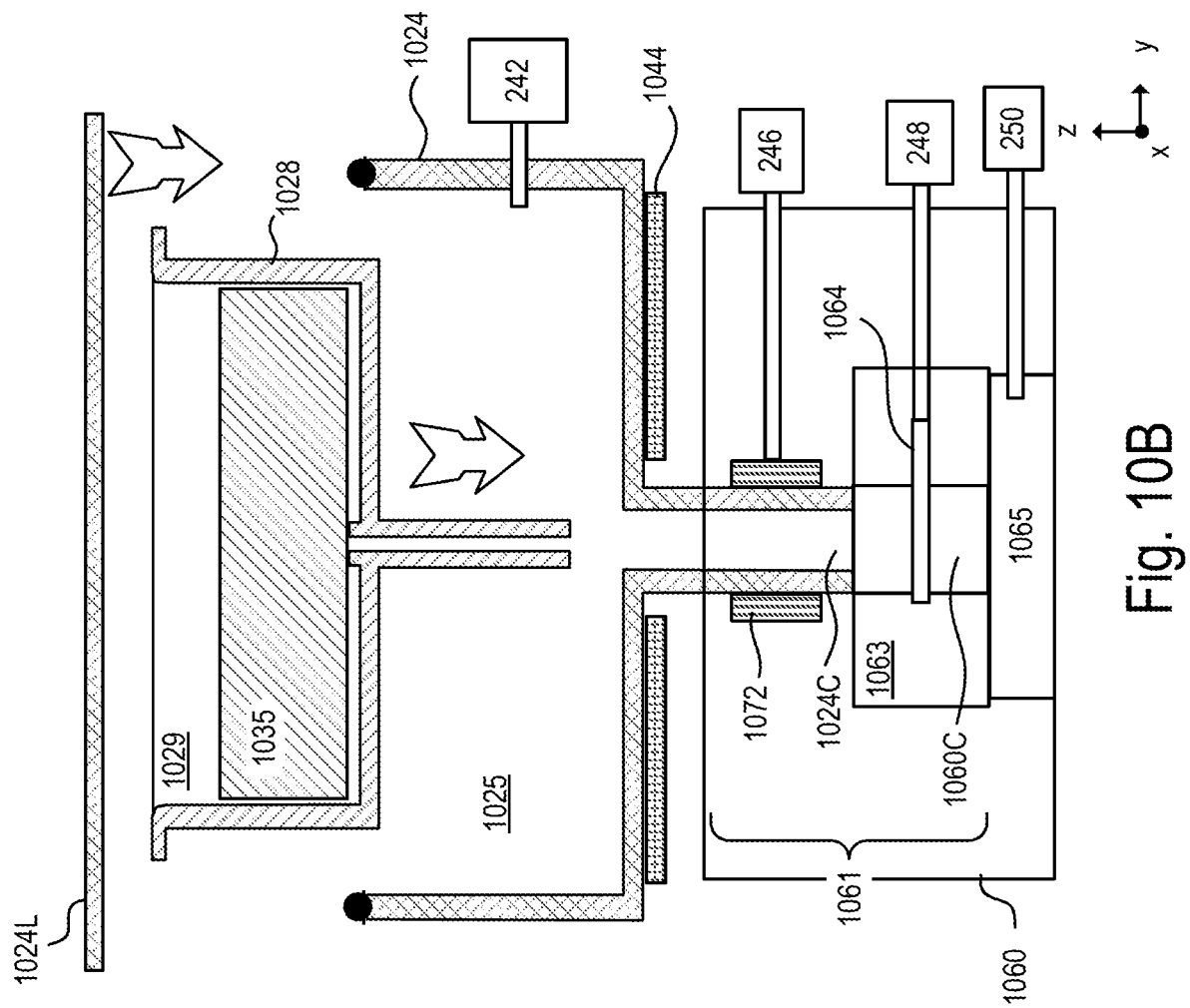
FIGS. 10A-10I are side cross-sectional views of an implementation of the apparatus of FIG. 1 at various steps of the procedure of FIG. 9.
Figure 10A:
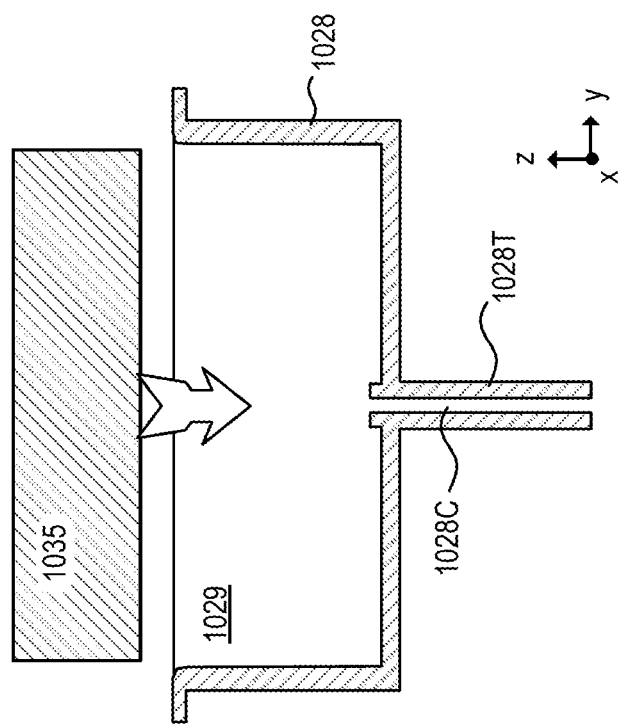

The removable carrier 1028, which houses the solid matter 1035, is inserted into the primary cavity 1025 of the priming chamber 1024 (982), as shown in FIG. 10B. The priming chamber 1025 is already fluidly connected to the transport system 1060, which means that there is a fluid flow path established between the primary cavity 1025 and the flow channel 1060C of the transport system 1060, for example, by way of the interior channel 1024C of the tube wall 1024T of the priming chamber 1024. Moreover, the transport system 1060 is in fluid communication with the reservoir system 110 (as discussed above).

Figure 10C:
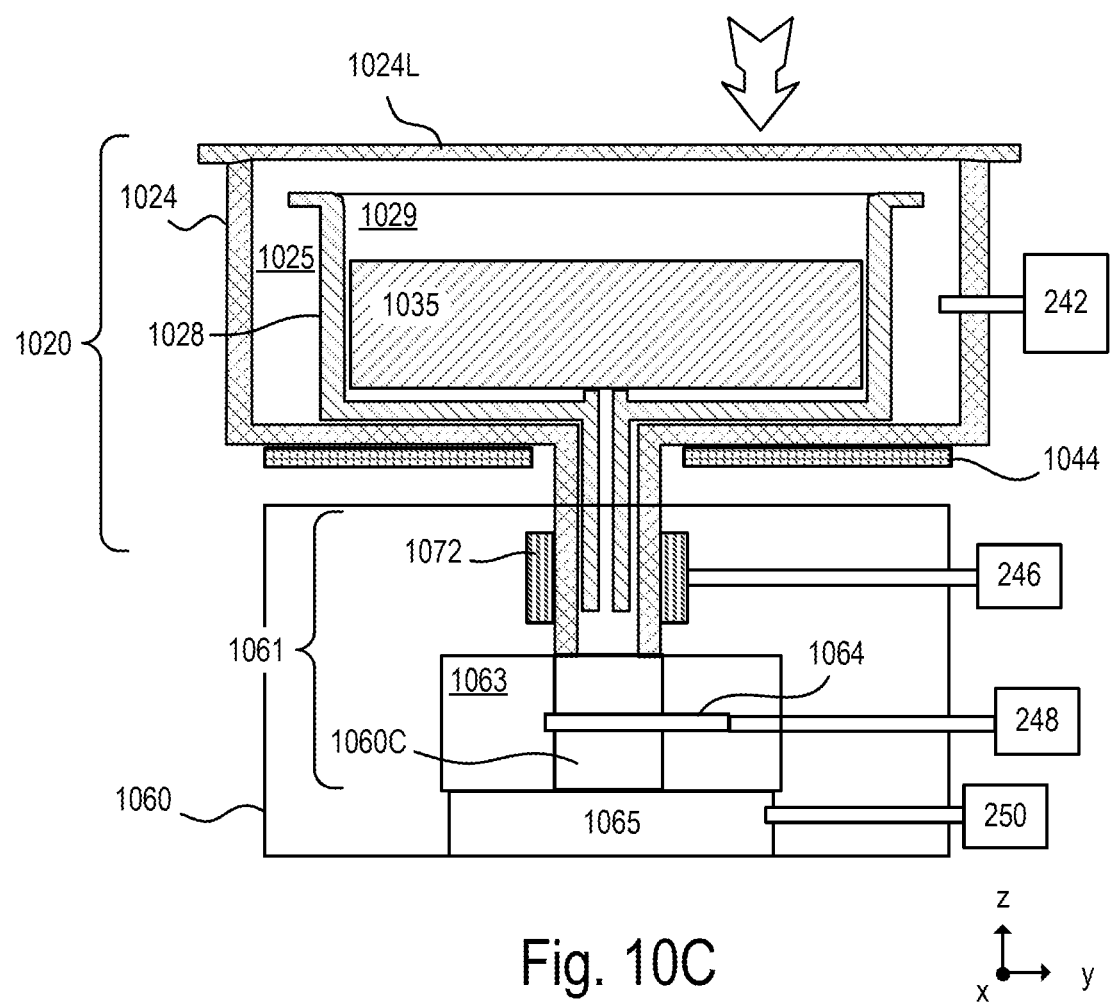

The primary cavity 1025 of the priming chamber 1024 is sealed (983), as shown in FIG. 10C. For example, the lid 1024L is secured to the rest of the priming chamber 1024. At least a portion of the transport system 1060 is maintained at a pressure below atmospheric pressure (984). For example, one or more of the other control devices 250 that are pressure control devices can, under instruction from the controller 254, maintain the pressure or reduce the pressure in one or more of the other components 1065. As discussed above, the other components 1065 can include a refill tank (such as the refill tank 368 or 868). Thus, in this example, a cavity of the refill tank 368 or 868 can be maintained a pressure below atmospheric pressure. Moreover, the portion of the transport system 1060 that is maintained at the pressure below atmospheric pressure (984) is in fluid communication with the regulation apparatus 1061. The pressure at which the portion of the transport system 1060 is maintained can be a high vacuum pressure (that is, as low as $10^{-7}$ Torr and on the order of $10^{-6}$ Torr).

A pressure in the primary cavity 1025 (and the secondary cavity 1029) is reduced to below atmospheric pressure (985). For example, the pressure control device 242 can pump enough air or matter out of the primary cavity 1025 and also the secondary cavity 1029 until the controller 254 determines (by way of a sensor in the sensor system 252) that the pressure within the primary cavity 1025 and the secondary cavity 1029 drops below a pre-determined threshold value. In particular, though not required, the pre-determined threshold value of the pressure can be substantially the same as the pressure maintained in the portion of the transport system 1060 (984). Thus, the pressure in the primary cavity 1025 and the secondary cavity 1029 can be reduced to a high vacuum pressure on the order of $10^{-6}$ Torr.

Figure 10D:
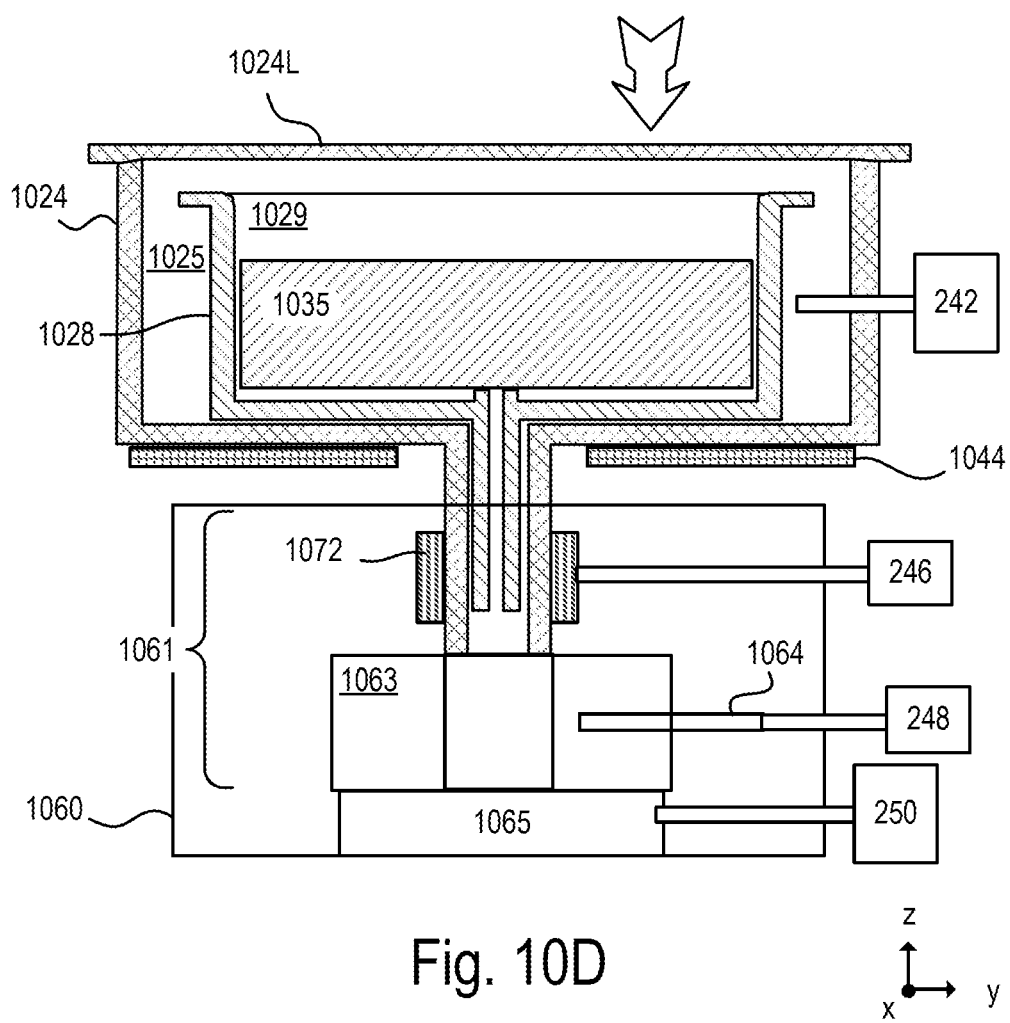

Next, the fluid flow path through the transport system 1060 is opened (986). For example, as shown in FIG. 10D, a gate 1064 of a gate valve arrangement 1063 is opened. As shown in FIG. 10C, when the gate 1064 is closed, it interacts with the flow channel 1060C of the transport system 1060. The gate 1064 is opened at this stage so as to prevent the melted material (from the solid matter 1035) from interacting with the gate 1064 at a later step in the procedure 980.

Figure 10E:
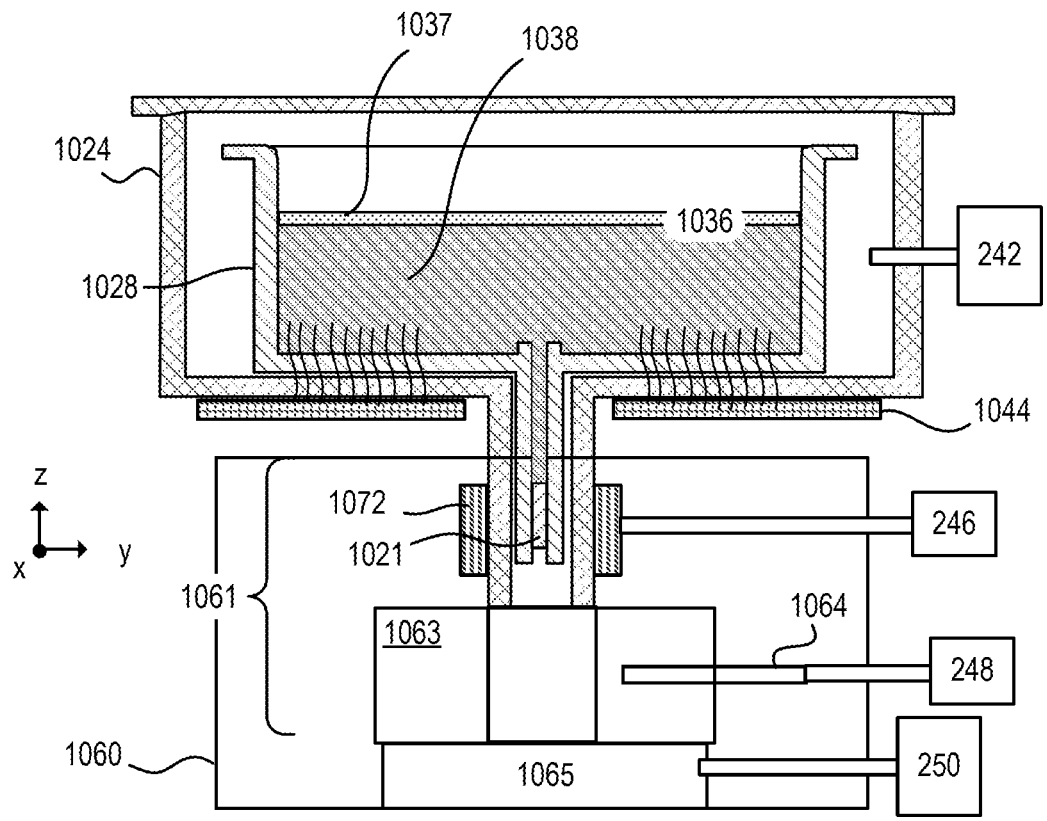

As shown in FIG. 10E, the inserted solid matter 1035 is heated to a temperature above the melting point of the target material 102 until the solid matter 1035 turns into a fluid material 1036 (987). As noted above, the fluid material 1036 includes the target material 1038 as well as non-target material 1037. In the implementation described, the non-target material 1037 is less dense than the target material 1038, and thus, the non-target material 1037 floats to the top of the fluid material 1036, as shown. The solid matter 1035 is heated by the application of heat from the temperature control device 1044, which is in communication with the controller 254. In the implementation of FIG. 10E, the temperature control device 1044 is in thermal communication with the priming chamber 1024, and the priming chamber 1024 and the removable carrier 1028 are made of sufficiently thermally conductive materials (such as metal or metal alloys) such that heat applied to an exterior of the priming chamber 1024 is efficiently transferred to the secondary cavity 1029, and this heat causes a change in state of the solid matter 1035 into the fluid material 1036. In some implementations in which the solid matter 1035 is tin ingot, the temperature of the secondary cavity 1029 is heated to above 450° F. (the melting point of tin).

As the solid matter 1035 is melted into the fluid material 1036, the fluid material 1036 is prevented from flowing through the open gate valve arrangement 1063 until enough of the solid matter 1035 has been converted into the fluid material 1036 and/or until the reservoir system requires more target material (988), as also shown in FIG. 10E. For example, the fluid material 1036 can be prevented from flowing through the open gate valve arrangement 1063 by being blocked by a solid mass 1021 that forms inside the interior channel 1028C of the tube wall 1028T of the removable carrier 1028. The solid mass 1021 forms because the fluid material 1036 cools down when it reaches the interior channel 1028C of the tube wall 1028T, which is held at a temperature that is below the melting point of the solid matter 1035.

A determination is made regarding whether enough of the solid matter 1035 has been converted into fluid material 1036 (989). For example, the controller 254 (FIG. 2) can make the determination at step 989 by analyzing an output from one or more sensors of the sensor system 252, such sensors configured to measure an amount of fluid material 1036 in the carrier 1028. Thus, if the level of fluid material 1036 falls below a predetermined level in the carrier 1028, then this might indicate that a certain amount of fluid material 1036 has been formed. This is because the fluid material 1036 can have a different density from the solid matter 1035 such that upon formation into the fluid, the level of material in the carrier 1028 drops. Moreover, this predetermined level can indicate that greater than 99% (or 99.9%) of the solid matter 1035 has been converted into the fluid material 1036.

Figure 10F:
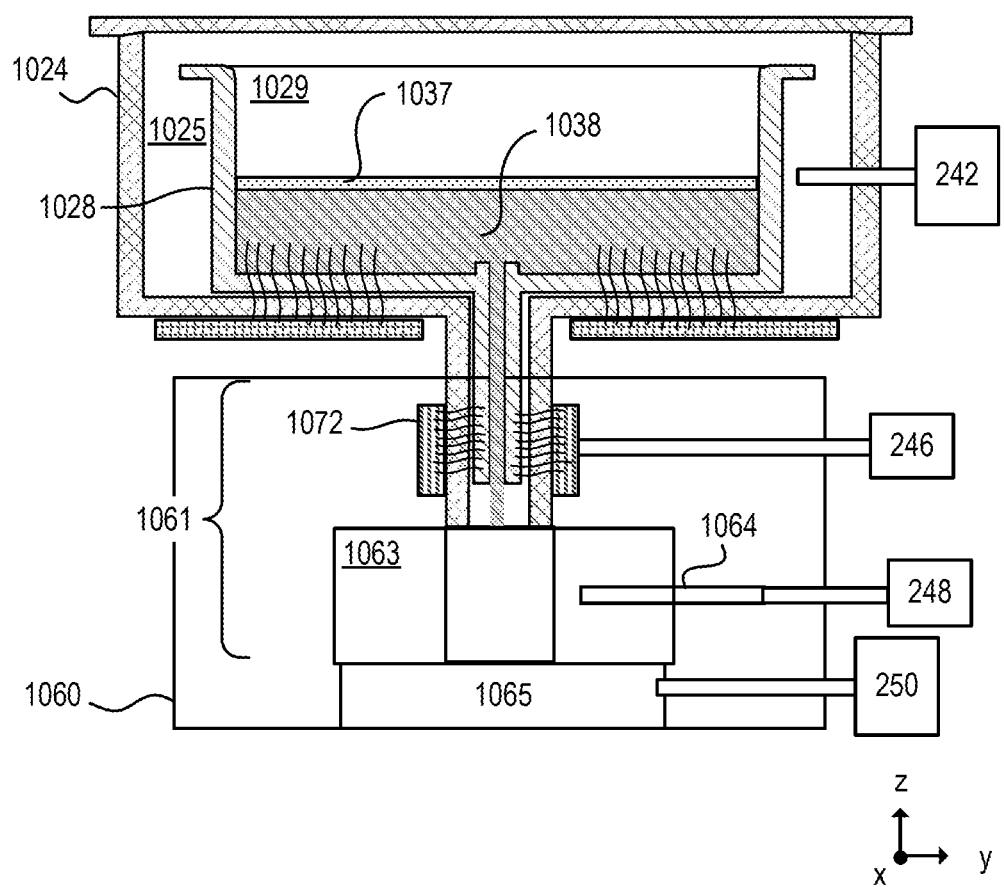
Figure 10G:
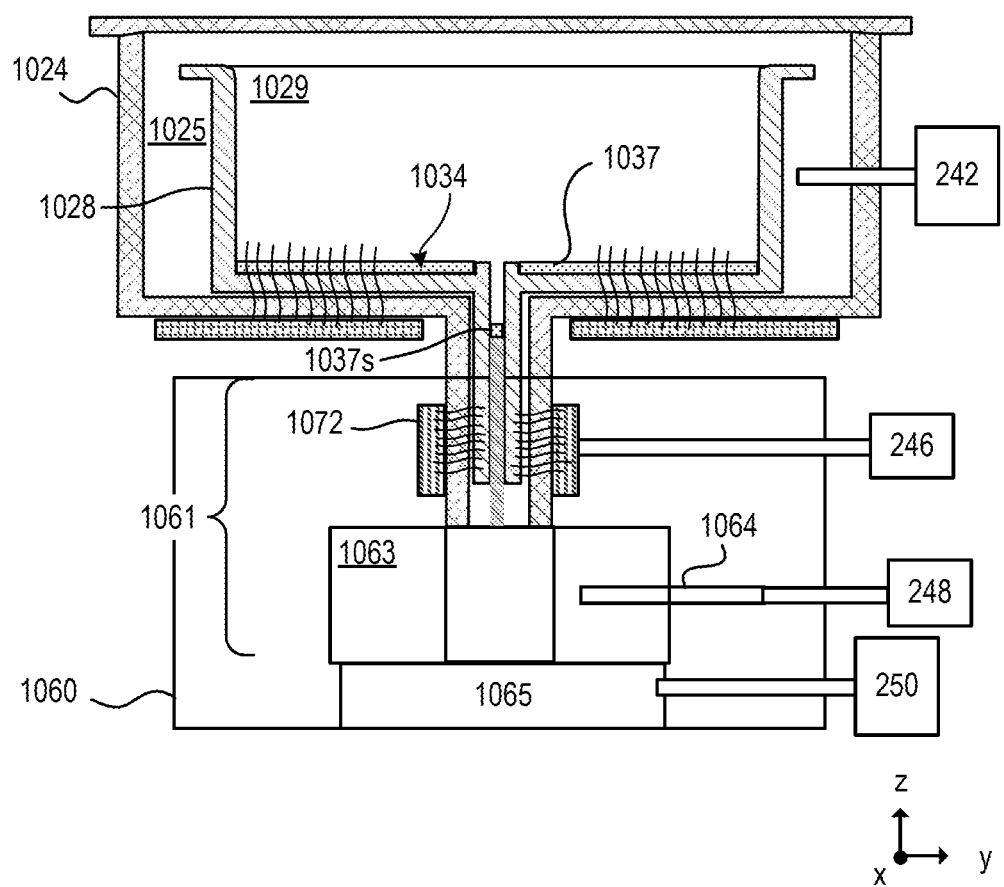

The fluid material 1036 is enabled to drain into the next portion (for example, into the components 1065) of the transport system 1060 and through the opened gate valve arrangement 1063 after it is determined that enough solid matter 1035 has been converted into fluid material 1036 (990). As an example, as shown in FIG. 10F, in order to drain the fluid material 1036 out of the carrier 1028 and into the next portion of the transport system 1060, the regulation temperature adjusting device 1072 that is in thermal communication with tube wall 1024T of the priming chamber 1024 supplies heat to the tube wall 1024T. Because the priming chamber 1024 and the removable carrier 1028 are conductive to heat transfer, the heat supplied to the tube wall 1024T conducts through the tube wall 1028T of the removable carrier 1028 and into the interior channel 1028C in which the solid mass 1021 is lodged. The heat that is supplied is high enough (that is, exceeds the melting point of the solid mass 1021) to melt the solid mass 1021 so that it also is converted into the target material 1038. This melted mass 1021 (which is mostly target material 1038) also falls from the weight of gravity along the −z axis along with the target material 1038 that is draining from the removable carrier 1028. The target material 1038 that is drained from the removable carrier 1028 enters the transport system 1060, which it is output into the reservoir system 110 as target material 102.

As mentioned above, because the non-target material 1037 is less dense than the target material 1038, there is a small amount 1037s of the non-target material 1037 that drains from the removable carrier 1028. The small amount 1037s of the non-target material 1037 that drains out of the removable carrier 1028 is correlated with or related to a ratio of a surface area of the region between the rim 732 and the inner surface 733 (as shown in FIG. 7A) to a size or extent of the 1028C interior channel taken along the x-y plane. The progression of the draining is depicted schematically in FIGS. 10F-10H.

Because the removable carrier 1028 is designed with the rim 732 (as discussed above with reference to FIGS. 7A-7C), substantially most of the non-target material 1037 remains in the well 1034 of the removable carrier 1028. In this way, the unwanted non-target material 1037 is not fed into the reservoir 112 and the nozzle supply system 104 and therefore is not supplied to the external environment 101, where such unwanted non-target material can cause problems for devices or apparatuses that rely on a high purity of the target material 102 to operate efficiently. As discussed above, in one example, the solid matter 1035 is a tin ingot that is 99.9% by weight pure. This means that there could be trace amounts of other non-tin material (such as lead and antimony) that could be present in the non-target material. Additionally, the tin that is present in the solid matter 1035 can chemically interact with other elements (such as oxygen) that are inside the removable carrier 1028 or the priming system 1020 to form molecules of tin such as tin oxide ($SnO_x$). The newly-designed removable carrier 1028 is configured to trap this non-tin material (which includes the tin oxide) and prevent it from flowing to the transport system 1060 while allowing the tin to flow to the transport system 1060 and to the reservoir system 110.

Figure 10H:
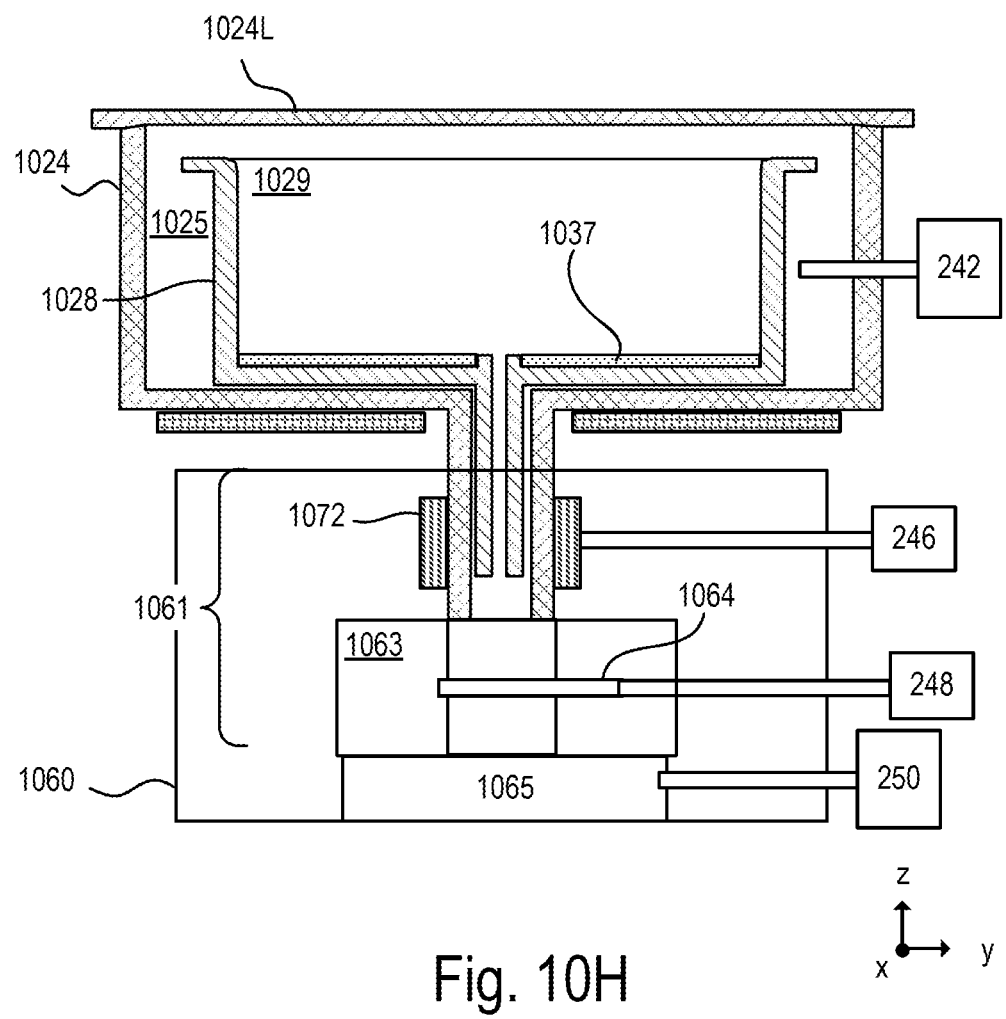
Figure 10I:
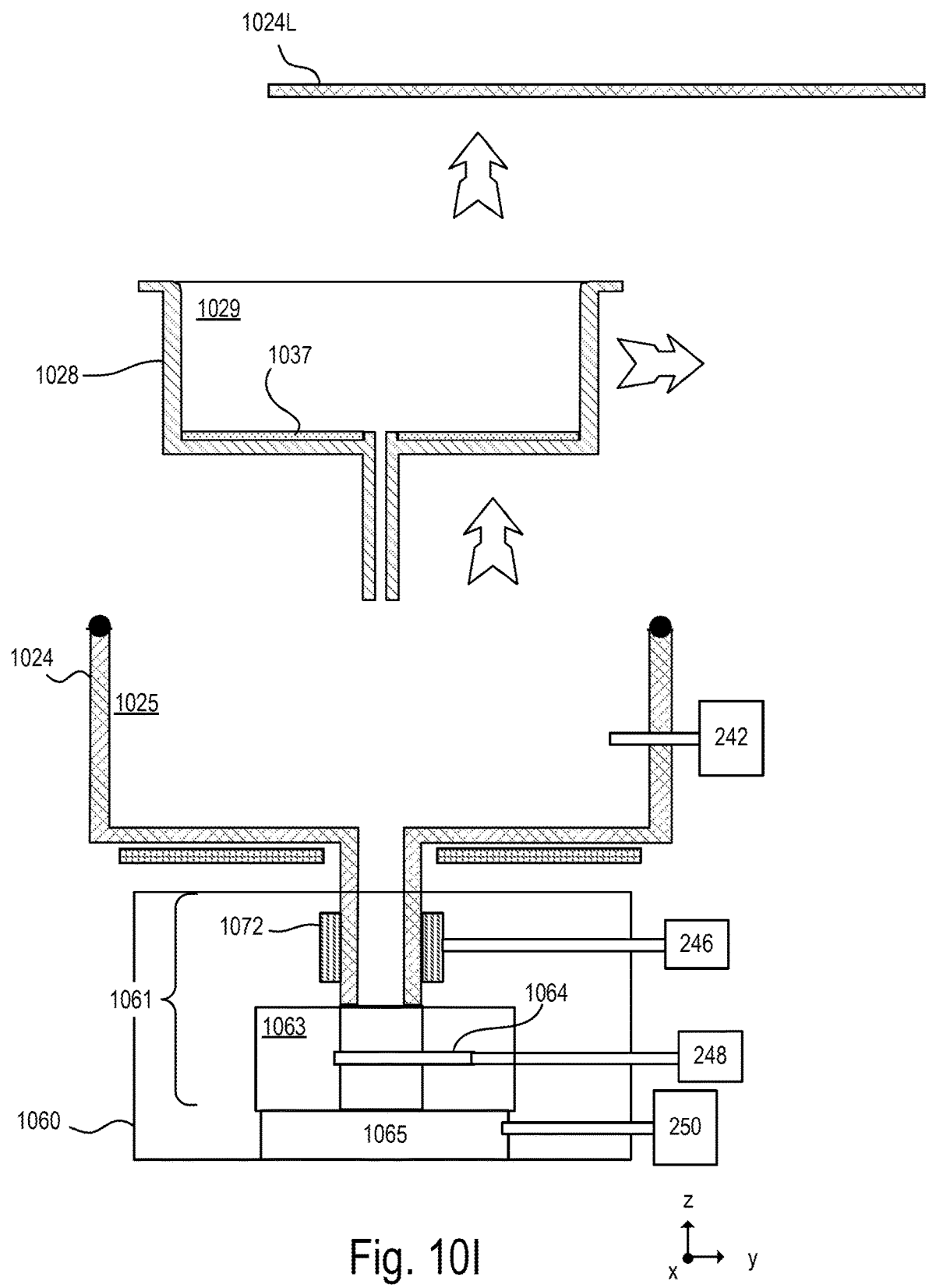

As shown in FIG. 10H, once all of the target material 1038 and the small amount 1037s of non-target material 1037 has drained from the removable carrier 1028, the freeze valve (that includes the regulation temperature adjusting device 1072) closes. That is, the regulation temperature adjusting device 1072 stops heating the tube wall 1024T of the priming chamber 1024. Additionally, the fluid flow path through the transport system 1060 is closed. For example, as shown in FIG. 10H, the gate 1064 of the gate valve arrangement 1063 is closed. The gate 1064 can be closed because there is no change of the melted material dripping onto the gate 1064 (because the target material 1038 and the small amount 1037s of non-target material 1037 has drained out of the removable carrier 1028).

Now that the gate 1064 is closed, the environment downstream of the gate valve arrangement 1063 is separately hermetically from the environment upstream of the gate valve arrangement 1063. Thus, it is now possible to maintain the sub-atmospheric pressure in the components that are downstream of the gate valve arrangement 1063 while enabling the primary cavity 1025 (and the secondary cavity 1029) to return to atmospheric pressure. First, the reservoir system 110 (which includes the reservoir 112), which downstream of the gate valve arrangement 1063, can be maintained at sub-atmospheric pressure. In this way, a new solid matter 135 can be installed in the apparatus 100 after the old one is drained from the priming system 120 and transport system 160, and upon the determination that the reservoir 112 required additional target material 102, without having to bring the reservoir 112 up to atmosphere, which would expose the walls of the reservoir 112 as well as any remaining target material 102 stored within the reservoir 112 to environment and unwanted chemicals (such as oxygen). Second, if a refill tank 368 (or 668) is used to store the target material 102, then the refill tank 368/668 also can be maintained at sub-atmospheric pressure. Accordingly, the refill tank 368/668 also does not need to be brought up to atmosphere. The interior walls of the refill tank 368/668 and any remaining target material 102 in the refill tank 368/668 would not be exposed to environment even though a new solid matter 135 must be installed in the apparatus 100.

The primary cavity 1025 and the secondary cavity 1029 are returned to atmospheric pressure by, for example, halting the pressure control device 242 from removing air from the primary cavity 1025 and the secondary cavity 1029. Once the primary cavity and the secondary cavity 1029 are brought back up to atmospheric pressure, the lid 1024L is removed from the priming chamber 1024 and the removable carrier 1028 is removed from the primary cavity 1025. The non-target material 1037 that remains in the well 1034 is removed with the removable carrier 1028.

Figure 11:
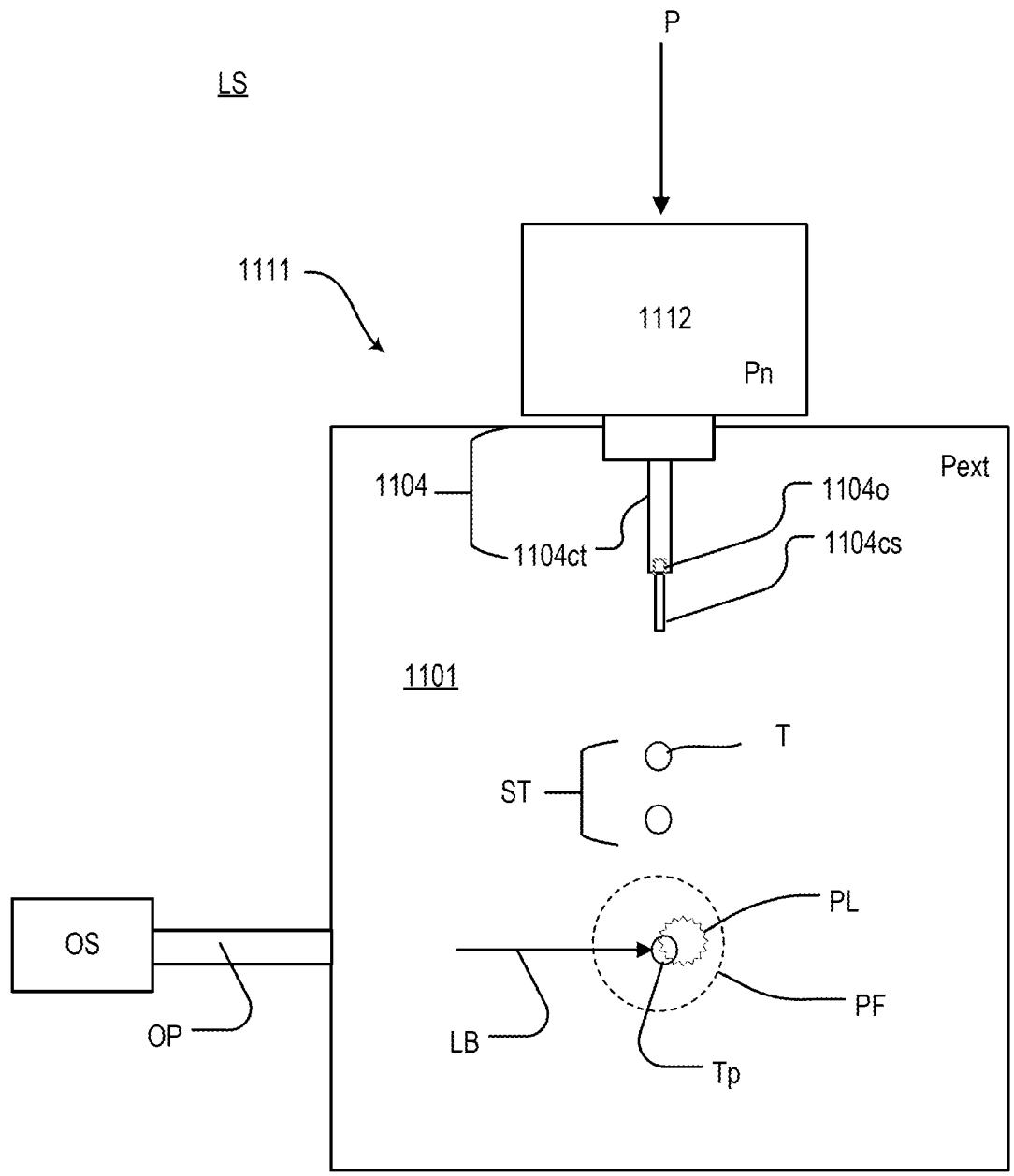
FIG. 11 is a block diagram of an implementation of an EUV light source that includes a reservoir system.

Referring to FIG. 11, a block diagram of an implementation of an EUV light source LS that includes a reservoir system 1111 is shown. The reservoir system 1111 emits a stream ST of targets T such that a target Tp is delivered to a plasma formation location PF in a vacuum environment 1101. The target Tp includes the target material 102. The target material 102 is any material that emits EUV light when in a plasma state. For example, the target material 102 can include water, tin, lithium, and/or xenon. The plasma formation location PF receives a light beam LB. The light beam LB is generated by an optical source OS and delivered to the vacuum environment 1101 along an optical path OP. An interaction between the light beam LB and the target material 102 in the target Tp produces a plasma PL that emits EUV light.

The reservoir system 1111 includes a nozzle supply system 1104, which includes a capillary tube 1104ct that is fluidly coupled to the reservoir 1112. The capillary tube 1104ct defines an orifice 1104o. The reservoir 1112 contains target material 102 under pressure Pn. The target material 102 is in a molten state and is able to flow, and the pressure in the vacuum environment 1101 Pext is lower than the pressure Pn. Thus, the target material 102 flows through the capillary tube 1104ct and is emitted into the vacuum environment 1101 through the orifice 1104o. The target material 102 can exit the orifice 1104o as a jet or continuous stream 1104cs of target material 102. The jet of target material 102 breaks up into the individual targets T (which can be droplets). The break-up of the jet 1104cs can be controlled such that the individual droplets coalesce into larger droplets that arrive at the plasma formation location PF at a desired rate. The targets T in the stream ST can be approximately spherical, with a diameter of about 30 µm.

Figure 12A:
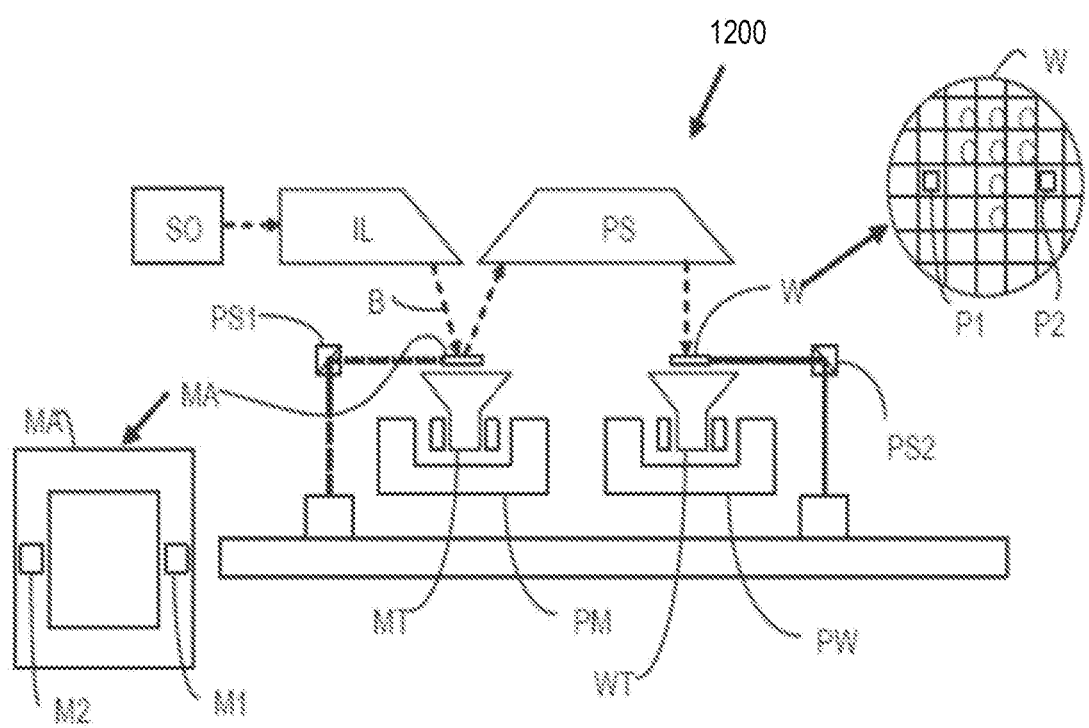
FIG. 12A is a block diagram of a lithographic apparatus that includes a source collector module, the lithographic apparatus configured to receive a target material supplied by the apparatus of FIG. 1.

FIG. 12A is a block diagram of a lithographic apparatus 1200 that includes a source collector module SO. The lithographic apparatus 1200 includes:

an illumination system (illuminator) IL configured to condition a radiation beam B (for example, EUV radiation).

a support structure (for example, a mask table) MT constructed to support a patterning device (for example, a mask or a reticle) MA and connected to a first positioner PM configured to accurately position the patterning device;

a substrate table (for example, a wafer table) WT constructed to hold a substrate (for example, a resist-coated wafer) W and connected to a second positioner PW configured to accurately position the substrate; and a projection system (for example, a reflective projection system) PS configured to project a pattern imparted to the radiation beam B by patterning device MA onto a target portion C (for example, including one or more dies) of the substrate W.

The illumination system IL can include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure can be a frame or a table, for example, which can be fixed or movable as required. The support structure can ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam can correspond to a particular functional layer in a device being created in the target portion, such as an integrated circuit.

The patterning device can be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system PS, like the illumination system IL, can include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment can therefore be provided to the whole beam path with the aid of a vacuum wall and vacuum pumps.

Figure 12B:
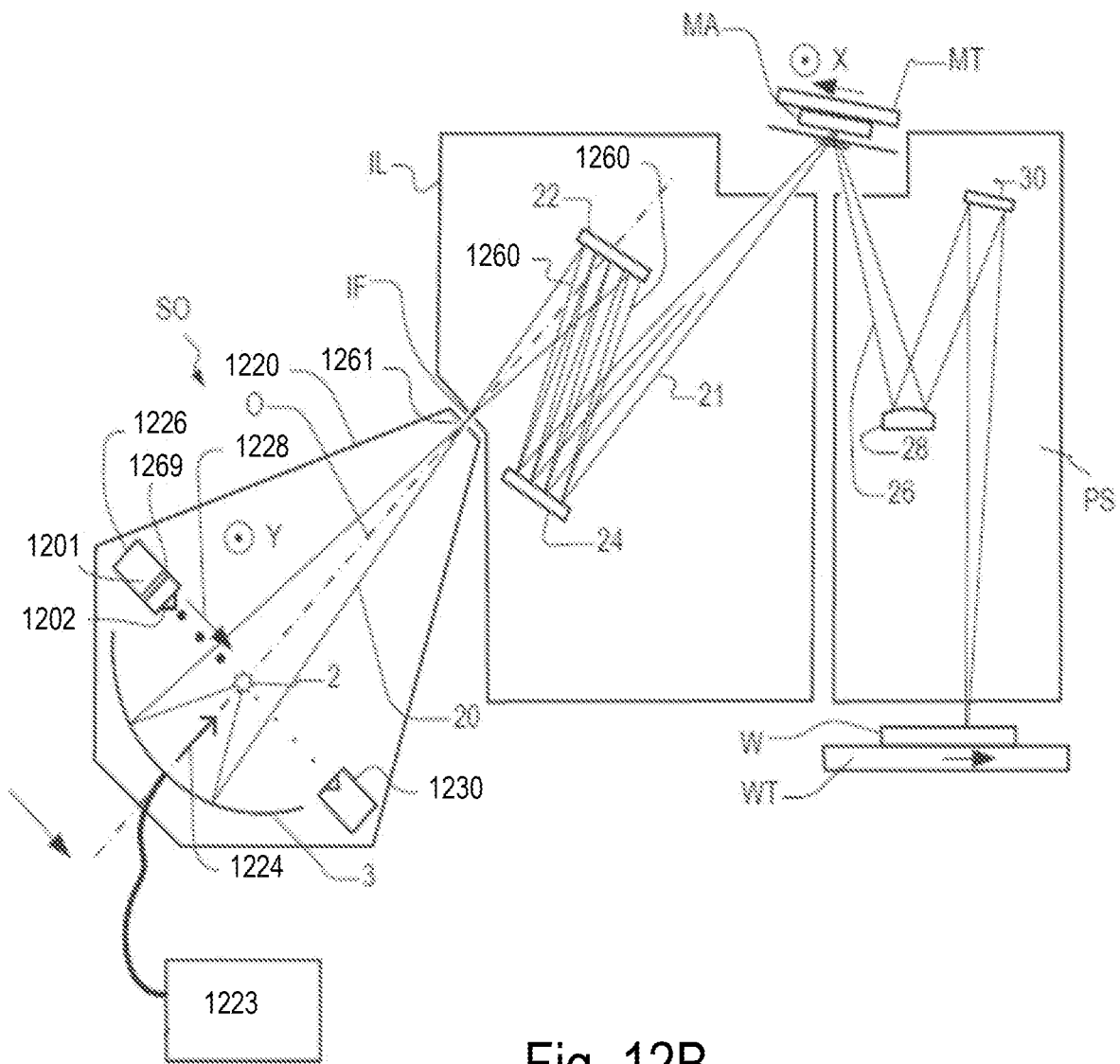
FIG. 12B is a more detailed schematic diagram of an implementation of the lithographic apparatus of FIG. 12A, including a source collector module, an illumination system, and a projection system.

In the example of FIGS. 12A and 12B, the apparatus is of a reflective type (for example, employing a reflective mask). The lithographic apparatus can be of a type having two (dual stage) or more substrate tables (and/or two or more patterning device tables). In such "multiple stage" machines, the additional tables can be used in parallel, or preparatory steps can be carried out on one or more tables while one or more other tables are being used for exposure.

Referring to FIG. 12A, the illuminator IL receives an extreme ultraviolet radiation beam from the source collector module SO. Methods to produce EUV light include, but are not necessarily limited to, converting a material into a plasma state that has at least one element, for example, xenon, lithium or tin, with one or more emission lines in the EUV range. In one such method, often termed laser produced plasma ("LPP") the required plasma is produced by irradiating a fuel, such as a droplet, stream or cluster of material having the required line-emitting element, with a laser beam. The source collector module SO can be part of an EUV radiation system including a laser, not shown in FIG. 12A, for providing the laser beam exciting the fuel. The resulting plasma emits output radiation, for example, EUV radiation, which is collected using a radiation collector, disposed in the source collector module. The laser and the source collector module can be separate entities, for example, when a carbon dioxide ($CO_2$) laser is used to provide the laser beam for fuel excitation.

In such cases, the laser is not considered to form part of the lithographic apparatus and the radiation beam is passed from the laser to the source collector module with the aid of a beam delivery system including, for example, suitable directing mirrors and/or a beam expander. In other cases the source may be an integral part of the source collector module, for example, when the source is a discharge produced plasma EUV generator, often termed as a DPP source.

The illuminator IL can include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can include various other components, such as facetted field and pupil mirror devices. The illuminator IL can be used to condition the radiation beam, to have a desired uniformity and intensity distribution in its cross-section.

The radiation beam B is incident on the patterning device (for example, mask) MA, which is held on the support structure (for example, mask table) MT, and is patterned by the patterning device. After being reflected from the patterning device (for example, mask) MA, the radiation beam B passes through the projection system PS, which focuses the beam onto a target portion C of the substrate W. With the aid of the second positioner PW and position sensor PS2 (for example, an interferometric device, linear encoder or capacitive sensor), the substrate table WT can be moved accurately, for example, so as to position different target portions C in the path of the radiation beam B. Similarly, the first positioner PM and another position sensor PS1 can be used to accurately position the patterning device (for example mask) MA with respect to the path of the radiation beam B. Patterning device (for example mask) MA and substrate W can be aligned using patterning device alignment marks M1, M2 and substrate alignment marks P1, P2.

The depicted apparatus can be used in at least one of the following modes:
1. In step mode, the support structure (for example, mask table) MT and the substrate table WT are kept essentially stationary, while an entire pattern imparted to the radiation beam is projected onto a target portion C at one time (that is, a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam is projected onto a target portion C (that is, a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.***

Combinations and/or variations on the above described modes of use or entirely different modes of use can also be employed.

FIG. 12B shows an implementation of the lithographic apparatus 1200 in more detail, including the source collector module SO, the illumination system IL, and the projection system PS. The source collector module SO is constructed and arranged such that a vacuum environment can be maintained in an enclosing structure 1220 of the source collector module SO. The systems IL and PS are likewise contained within vacuum environments of their own. An EUV radiation emitting plasma 2 can be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 1221 in the enclosing structure 1220. The virtual source point IF is an image of the radiation emitting plasma 2.

From the aperture 1221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA (as shown by reference 1260). Upon reflection of the beam 21 at the patterning device MA, held by the support structure (mask table) MT, a patterned beam 26 is formed and the patterned beam 26 is imaged by the projection system PS via reflective elements 28, onto a substrate W held by the substrate table WT. To expose a target portion C on substrate W, pulses of radiation are generated while substrate table WT and patterning device table MT perform synchronized movements to scan the pattern on patterning device MA through the slit of illumination.

Each system IL and PS is arranged within its own vacuum or near-vacuum environment, defined by enclosing structures similar to enclosing structure 1220. More elements than shown can generally be present in illumination system IL and projection system PS. Further, there can be more mirrors present than those shown. For example, there can be one to six additional reflective elements present in the illumination system IL and/or the projection system PS, besides those shown in FIG. 12B.

Considering source collector module SO in more detail, a laser energy source including a laser 1223 is arranged to deposit laser energy 1224 into a fuel that includes a target material. The target material can be any material that emits EUV radiation in a plasma state, such as xenon (Xe), tin (Sn), or lithium (Li). The plasma 2 is a highly ionized plasma with electron temperatures of several 10's of electron volts (eV). Higher energy EUV radiation can be generated with other fuel materials, for example, terbium (Tb) and gadolinium (Gd). The energetic radiation generated during de-excitation and recombination of these ions is emitted from the plasma, collected by a near-normal incidence collector 3 and focused on the aperture 1221. The plasma 2 and the aperture 1221 are located at first and second focal points of collector CO, respectively.

Although the collector 3 shown in FIG. 12B is a single curved mirror, the collector can take other forms. For example, the collector may be a Schwarzschild collector having two radiation collecting surfaces. In an implementation, the collector is a grazing incidence collector that includes a plurality of substantially cylindrical reflectors nested within one another.

To deliver the fuel, which, for example, is liquid tin, a droplet generator 1226 is arranged within the enclosure 1220, arranged to fire a high frequency stream 1228 of droplets toward the desired location of plasma 2. The droplet generator 1226 can be the reservoir system 110. In operation, laser energy 1224 is delivered in a synchronism with the operation of droplet generator 1226, to deliver impulses of radiation to turn each fuel droplet into a plasma 2. The frequency of delivery of droplets may be several kilohertz, for example 50 kHz. In practice, laser energy 1224 is delivered in at least two pulses: a pre pulse with limited energy is delivered to the droplet before it reaches the plasma location, in order to vaporize the fuel material into a small cloud, and then a main pulse of laser energy 1224 is delivered to the cloud at the desired location, to generate the plasma 2. A trap 1230 is provided on the opposite side of the enclosing structure 1220, to capture fuel that is not, for whatever reason, turned into plasma.

The droplet generator 1226 includes a reservoir 1201 (which can be the reservoir 112) which contains the fuel liquid (for example, molten tin) and can include a filter 1269 and a nozzle 1202 that are a part of the nozzle supply system 104. The nozzle 1202 is configured to eject droplets of the fuel liquid towards the plasma 2 formation location. The droplets of fuel liquid may be ejected from the nozzle 1202 by a combination of pressure within the reservoir 1201 and a vibration applied to the nozzle by a piezoelectric actuator (not shown).

As the skilled reader will know, reference axes X, Y, and Z may be defined for measuring and describing the geometry and behavior of the apparatus, its various components, and the radiation beams 20, 21, 26. At each part of the apparatus, a local reference frame of X, Y and Z axes may be defined.

In the example of FIG. 12B, the Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 1228, while the Y axis is orthogonal to that, pointing out of the page as indicated. On the other hand, in the vicinity of the support structure MT that holds the reticle MA, the X axis is generally transverse to a scanning direction aligned with the Y axis. For convenience, in this area of the schematic diagram FIG. 12B, the X axis points out of the page, again as marked. These designations are conventional in the art and will be adopted herein for convenience. In principle, any reference frame can be chosen to describe the apparatus and its behavior.

Numerous additional components used in the operation of the source collector module and the lithographic apparatus 1200 as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus 1200.

Figure 13:
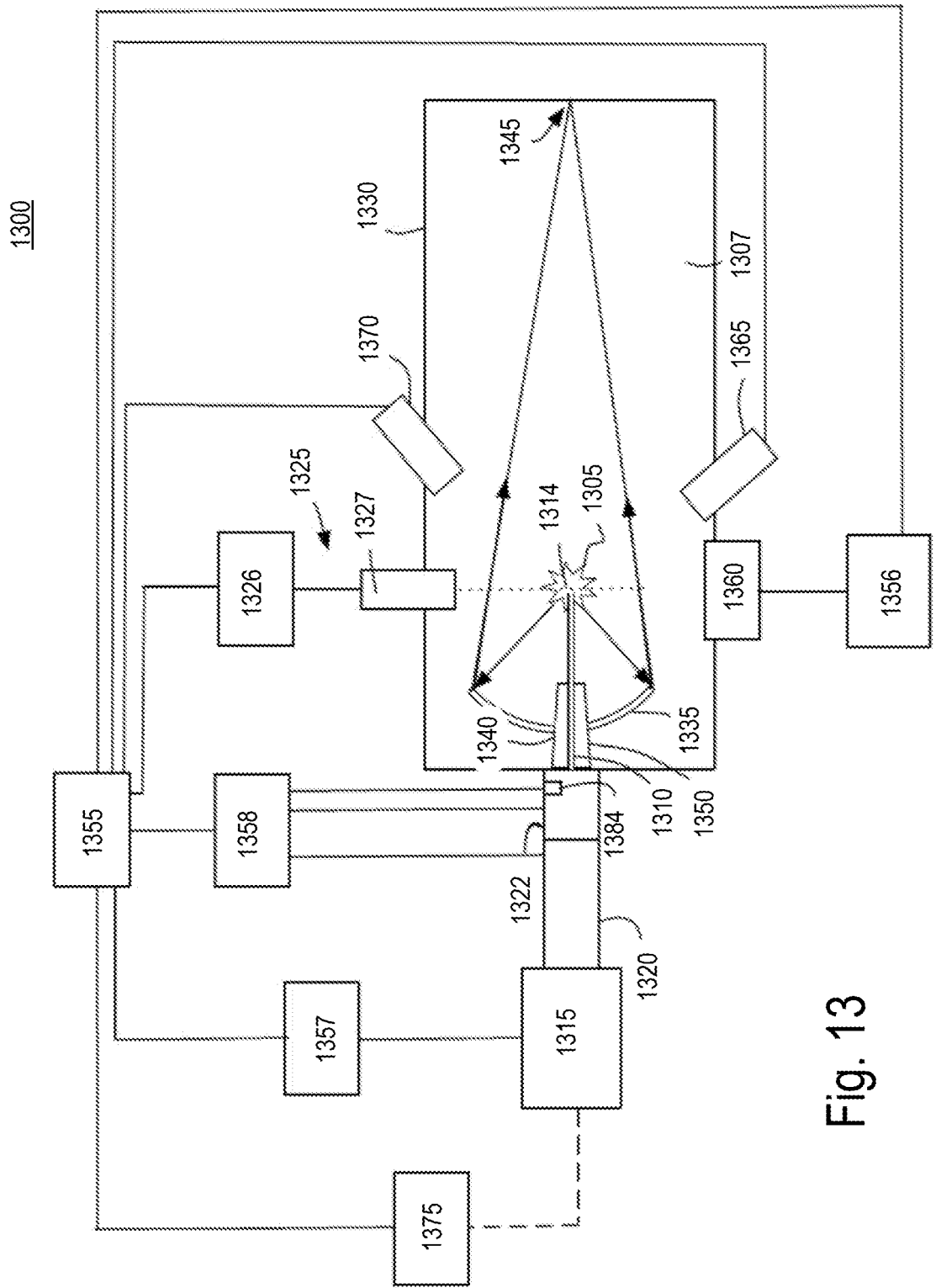
FIG. 13 is a schematic diagram of an implementation of an EUV light source that can be used as the source collector module in the lithographic apparatus of FIGS. 12A and 12B.

Referring to FIG. 13, an implementation of an LPP EUV light source 1300 is shown. The light source 1300 may be used as the source collector module SO in the lithographic apparatus 1200. Furthermore, the optical source OS of FIG. 11 can be part of the drive laser 1315. The drive laser 1315 can be used as the laser 1223 (FIG. 12B).

The LPP EUV light source 1300 is formed by irradiating a target mixture 1314 at a plasma formation location 1305 with an amplified light beam 1310 that travels along a beam path toward the target mixture 1314. The target material 102, and the targets T in the stream ST discussed with respect to FIG. 11 can be or include the target mixture 1314. The plasma formation location 1305 is within an interior 1307 of a vacuum chamber 1330. When the amplified light beam 1310 strikes the target mixture 1314, a target material within the target mixture 1314 is converted into a plasma state that has an element with an emission line in the EUV range. The created plasma has certain characteristics that depend on the composition of the target material within the target mixture 1314. These characteristics can include the wavelength of the EUV light produced by the plasma and the type and amount of debris released from the plasma.

The light source 1300 also includes the supply system 1325 that delivers, controls, and directs the target mixture 1314 in the form of liquid droplets, a liquid stream, solid particles or clusters, solid particles contained within liquid droplets or solid particles contained within a liquid stream. The target mixture 1314 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 1314 can also include impurities such as non-target particles. Thus, in the situation in which there are no impurities, the target mixture 1314 is made up of only the target material. The target mixture 1314 is delivered by the supply system 1325 into the interior 1307 of the chamber 1330 and to the plasma formation location 1305.

The light source 1300 includes a drive laser system 1315 that produces the amplified light beam 1310 due to a population inversion within the gain medium or mediums of the laser system 1315. The light source 1300 includes a beam delivery system between the laser system 1315 and the plasma formation location 1305, the beam delivery system including a beam transport system 1320 and a focus assembly 1322. The beam transport system 1320 receives the amplified light beam 1310 from the laser system 1315, and steers and modifies the amplified light beam 1310 as needed and outputs the amplified light beam 1310 to the focus assembly 1322. The focus assembly 1322 receives the amplified light beam 1310 and focuses the beam 1310 to the plasma formation location 1305.

In some implementations, the laser system 1315 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 1315 produces an amplified light beam 1310 due to the population inversion in the gain media of the laser amplifiers even if there is no laser cavity. Moreover, the laser system 1315 can produce an amplified light beam 1310 that is a coherent laser beam if there is a laser cavity to provide enough feedback to the laser system 1315. The term "amplified light beam" encompasses one or more of: light from the laser system 1315 that is merely amplified but not necessarily a coherent laser oscillation and light from the laser system 1315 that is amplified and is also a coherent laser oscillation.

The optical amplifiers in the laser system 1315 can include as a gain medium a filling gas that includes $CO_2$ and may amplify light at a wavelength of between about 9100 and about 11000 nm, and in particular, at about 10600 nm, at a gain greater than or equal to 800 times. Suitable amplifiers and lasers for use in the laser system 1315 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The pulse repetition rate may be, for example, 50 kHz. The optical amplifiers in the laser system 1315 can also include a cooling system such as water that may be used when operating the laser system 1315 at higher powers.

The light source 1300 includes a collector mirror 1335 having an aperture 1340 to allow the amplified light beam 1310 to pass through and reach the plasma formation location 1305. The collector mirror 1335 can be, for example, an ellipsoidal mirror that has a primary focus at the plasma formation location 1305 and a secondary focus at an intermediate location 1345 (also called an intermediate focus) where the EUV light can be output from the light source 1300 and then input to, for example, an integrated circuit lithography tool (not shown). The light source 1300 can also include an open-ended, hollow conical shroud 1350 (for example, a gas cone) that tapers toward the plasma formation location 1305 from the collector mirror 1335 to reduce the amount of plasma-generated debris that enters the focus assembly 1322 and/or the beam transport system 1320 while allowing the amplified light beam 1310 to reach the plasma formation location 1305.

The light source 1300 can also include a master controller 1355 that is connected to a droplet position detection feedback system 1356, a laser control system 1357, and a beam control system 1358. The light source 1300 can include one or more target or droplet imagers 1360 that provide an output indicative of the position of a droplet, for example, relative to the plasma formation location 1305 and provide this output to the droplet position detection feedback system 1356, which can, for example, compute a droplet position and trajectory from which a droplet position error can be computed either on a droplet by droplet basis or on average. The droplet position detection feedback system 1356 thus provides the droplet position error as an input to the master controller 1355. The master controller 1355 can provide a laser position, direction, and timing correction signal, for example, to the laser control system 1357 that may be used, for example, to control the laser timing circuit and/or to the beam control system 1358 to control an amplified light beam position and shaping of the beam transport system 1320 to change the location and/or focal power of the beam focal spot within the chamber 1330.

The supply system 1325 includes a target material delivery control system 1326 that is operable, in response to a signal from the master controller 1355, for example, to modify the release point of the droplets as released by a target material supply apparatus 1327 to correct for errors in the droplets arriving at the desired plasma formation location 1305.

Additionally, the light source 1300 can include light source detectors 1365 and 1370 that measure one or more EUV light parameters, including but not limited to, pulse energy, energy distribution as a function of wavelength, energy within a particular band of wavelengths, energy outside of a particular band of wavelengths, and angular distribution of EUV intensity and/or average power.

The light source 1300 can also include a guide laser 1375 that may be used to align various sections of the light source 1300 or to assist in steering the amplified light beam 1310 to the plasma formation location 1305. In connection with the guide laser 1375, the light source 1300 includes a metrology system 1384 that is placed within the focus assembly 1322 to sample a portion of light from the guide laser 1375 and the amplified light beam 1310.

The implementations may further be described using the following clauses:

1. An apparatus for supplying a target material, the apparatus comprising:
   a reservoir system comprising a reservoir in fluid communication with a nozzle supply system;
   a priming system comprising:
      a priming chamber defining a primary cavity; and
      a removable carrier configured to be received in the primary cavity, the removable carrier defining a secondary cavity configured to receive a solid matter that includes the target material; and
   a transport system that extends from the priming system to the reservoir system, the transport system configured to provide a fluid flow path between the priming system and the reservoir system.

2. The apparatus of clause 1, wherein the removable carrier includes a lower wall configured to receive the solid matter, the lower wall defining a transport opening that, when the removable carrier is received in the primary cavity, is in fluid communication with the transport system.

3. The apparatus of clause 2, wherein the lower wall includes a rim that extends above the lower wall into the secondary cavity, the rim defining the perimeter of the transport opening, wherein a plane of the lower wall is below a plane of the rim.

4. The apparatus of clause 3, wherein, in use, target material in the fluid state is drained from the secondary cavity at least in part due to the transport system, and after the target material in the fluid state is drained, non-target material in the fluid state is captured in a well that is defined by the rim and the lower wall and prevented from being drained from the secondary cavity.

5. The apparatus of clause 1, wherein:
the transport system comprises a regulation apparatus configured to control a flow of fluid from the priming system; and
the priming system comprises a tube wall that extends from the priming chamber, an interior of the tube wall in fluid communication with the transport opening defined by the lower wall of the removable carrier and the fluid flow path of the transport system.

6. The apparatus of clause 5, wherein the regulation apparatus comprises a dual-valve assembly.

7. The apparatus of clause 6, wherein the dual-valve assembly comprises:
a freeze valve; and
a gate valve.

8. The apparatus of clause 7, wherein the gate valve is between the freeze valve and the reservoir system such that target material avoids contact with a gate of the gate valve.

9. The apparatus of clause 7, wherein the freeze valve includes a regulation temperature adjusting device in thermal communication with the tube wall.

10. The apparatus of clause 1, wherein the transport system comprises:
a refill tank in the fluid flow path between the priming system and the reservoir system; and
a regulation apparatus for controlling a flow of fluid between the priming system and the refill tank;
wherein the refill tank defines a refill cavity configured to receive the target material in the form of fluid matter from the priming system by way of the regulation apparatus.

11. The apparatus of clause 10, wherein:
the priming chamber is configured to be hermetically sealed with the removable carrier received in the primary cavity and the primary cavity is configured to be pumped down to a primary pressure below atmospheric pressure in use;
the refill tank is configured to be hermetically sealed and the refill cavity is configured to be pumped down to a refill pressure below atmospheric pressure in use; and
in use, the primary cavity is in fluid communication with the refill cavity when the regulation apparatus is in an open state.

12. The apparatus of clause 11, wherein the primary pressure is less than or equal to about $10^{-6}$ Torr and the refill pressure is less than or equal to $10^{-6}$ Torr.

13. The apparatus of clause 10, further comprising a refill vacuum pump fluidly connected to the refill cavity and configured to adjust a refill pressure within the refill cavity.

14. The apparatus of clause 1, wherein the priming chamber is configured to be hermetically sealed with the removable carrier received in the primary cavity.

15. The apparatus of clause 14, further comprising a priming vacuum pump fluidly connected to the primary cavity by way of a valve system, and configured to adjust a primary pressure within the primary cavity.

16. The apparatus of clause 1, wherein the priming system comprises a priming temperature adjusting device in thermal communication with the removable carrier such that a temperature in the secondary cavity is controlled by the priming temperature adjusting device.

17. A method for supplying a target material, the method comprising:
inserting a solid matter that includes the target material into a secondary cavity of a removable carrier;
inserting the removable carrier into a primary cavity of a priming chamber that is connected to a transport system that is in fluid communication with a reservoir system that comprises a reservoir in fluid communication with a nozzle supply system;
maintaining a pressure in at least a portion of the transport system below atmospheric pressure;
reducing a pressure in the primary cavity and the secondary cavity to below atmospheric pressure;
opening a gate valve in the transport system;
heating the inserted solid matter to a temperature above a melting point of the target material until the solid matter turns into fluid matter that includes the target material;
preventing the fluid matter from flowing through the open gate valve until enough solid matter has been converted into fluid matter; and
enabling the fluid matter to drain into the transport system portion and through the opened gate valve after it is determined that enough solid matter has been converted into fluid matter.

18. The method of clause 17, wherein maintaining the pressure in at least the portion of the transport system below atmospheric pressure comprises maintaining the pressure in a refill tank of the transport system below atmospheric pressure, the refill tank being in fluid communication with the reservoir system by way of a refill valve system.

19. The method of clause 17, wherein opening the gate valve in the transport system comprises opening the gate valve in the transport system when it is determined that the pressure in the primary cavity and the secondary cavity is substantially close to the pressure in the transport system portion.

20. The method of clause 19, wherein determining that the pressure in the primary cavity and the secondary cavity is substantially close to the pressure in the transport system portion comprises determining that the pressures are within $10^{-7}$ Torr of each other.

21. The method of clause 17, wherein connecting the priming chamber to the transport system extending between the removable carrier and the reservoir system comprises inserting a tube wall that extends from the priming chamber and defines an interior that is in fluid communication with a transport opening of the priming chamber into a regulation apparatus, the regulation apparatus configured to control a flow of fluid from the priming chamber.

22. The method of clause 21, wherein connecting the priming chamber to the transport system extending between the removable carrier and the reservoir system comprises connecting the regulation apparatus to a refill tank that defines a refill cavity, the method further comprising providing a fluid flow path between the refill cavity and the reservoir system and a fluid flow path between the regulation apparatus and the refill cavity.

23. The method of clause 21, wherein connecting the priming chamber to the transport system extending between the removable carrier and the reservoir system comprises connecting the regulation apparatus to the reservoir system, the method further comprising providing a fluid flow path between the regulation apparatus and the reservoir system.

24. The method of clause 17, wherein enabling the fluid matter to drain into the transport system portion and through the opened gate valve comprises enabling fluid matter comprising target fluid matter to drain into the transport system portion and through the opened gate valve.

25. The method of clause 24, further comprising trapping non-target material in the removable carrier after the target fluid matter is drained from the removable carrier and into the transport system portion, wherein the non-target material has a density that is lower than a density of the target fluid matter.

26. The method of clause 24, further comprising, after the target fluid matter is drained into the transport system portion, then:
closing the gate valve;
enabling the pressure in the primary cavity to come up to atmospheric pressure; and
removing the removable carrier from the primary cavity.

27. The method of clause 26, further comprises disposing of the removed removable carrier.

28. The method of clause 26, wherein removing the removable carrier comprises removing the trapped non-target material.

29. The method of clause 17, wherein enabling the fluid matter to drain into the transport system portion and through the opened gate valve after it is determined that enough solid matter has been converted into fluid matter comprises enabling the fluid matter to fall out of the secondary cavity of the removable carrier and into the transport system portion due to the force of gravity and without the use of a pressure differential between the secondary cavity and the transport system portion.

30. The method of clause 17, wherein enabling the fluid matter to drain into the transport system portion and through the opened gate valve comprises avoiding contact between the fluid matter and a gate of the opened gate valve.

31. The method of clause 17, wherein maintaining the pressure in at least the portion of the transport system below atmospheric pressure comprises maintaining the pressure in at least the portion of the transport system at or below around $10^{-6}$ Torr.

32. The method of clause 17, wherein reducing the pressure in the primary cavity and the secondary cavity to below atmospheric pressure comprises reducing the pressure in the primary cavity and the secondary cavity to a value that is close to the pressure in the portion of the transport system.

Other implementations are within the scope of the following claims.

What is claimed is:

1. An apparatus for supplying a target material, the apparatus comprising:
a reservoir system comprising a reservoir in fluid communication with a nozzle supply system;
a priming system comprising:
a priming chamber defining a primary cavity; and
a removable carrier configured to be received in the primary cavity, the removable carrier defining a secondary cavity configured to receive a solid matter that includes the target material; and
a transport system that extends from the priming system to the reservoir system, the transport system configured to provide a fluid flow path between the priming system and the reservoir system.

2. The apparatus of claim 1, wherein the removable carrier includes a lower wall configured to receive the solid matter, the lower wall defining a transport opening that, when the removable carrier is received in the primary cavity, is in fluid communication with the transport system.

3. The apparatus of claim 2, wherein the lower wall includes a rim that extends above the lower wall into the secondary cavity, the rim defining the perimeter of the transport opening, wherein a plane of the lower wall is below a plane of the rim.

4. The apparatus of claim 3, wherein, in use, target material in the fluid state is drained from the secondary cavity at least in part due to the transport system, and after the target material in the fluid state is drained, non-target material in the fluid state is captured in a well that is defined by the rim and the lower wall and prevented from being drained from the secondary cavity.

5. The apparatus of claim 1, wherein:
the transport system comprises a regulation apparatus configured to control a flow of fluid from the priming system; and
the priming system comprises a tube wall that extends from the priming chamber, an interior of the tube wall in fluid communication with the transport opening defined by the lower wall of the removable carrier and the fluid flow path of the transport system.

6. The apparatus of claim 5, wherein the regulation apparatus comprises a dual-valve assembly that includes:
a freeze valve; and
a gate valve.

7. The apparatus of claim 6, wherein:
the gate valve is between the freeze valve and the reservoir system such that target material avoids contact with a gate of the gate valve; and
the freeze valve includes a regulation temperature adjusting device in thermal communication with the tube wall.

8. The apparatus of claim 1, wherein the transport system comprises:
a refill tank in the fluid flow path between the priming system and the reservoir system; and
a regulation apparatus for controlling a flow of fluid between the priming system and the refill tank;
wherein the refill tank defines a refill cavity configured to receive the target material in the form of fluid matter from the priming system by way of the regulation apparatus.

9. The apparatus of claim 8, wherein:
the priming chamber is configured to be hermetically sealed with the removable carrier received in the primary cavity and the primary cavity is configured to be pumped down to a primary pressure below atmospheric pressure in use;
the refill tank is configured to be hermetically sealed and the refill cavity is configured to be pumped down to a refill pressure below atmospheric pressure in use; and in use, the primary cavity is in fluid communication with the refill cavity when the regulation apparatus is in an open state.

10. The apparatus of claim 9, wherein the primary pressure is less than or equal to about $10^{-6}$ Torr and the refill pressure is less than or equal to $10^{-6}$ Torr.

11. The apparatus of claim 8, further comprising a refill vacuum pump fluidly connected to the refill cavity and configured to adjust a refill pressure within the refill cavity.

12. The apparatus of claim 1, wherein the priming chamber is configured to be hermetically sealed with the removable carrier received in the primary cavity, the apparatus further comprising a priming vacuum pump fluidly connected to the primary cavity by way of a valve system, and configured to adjust a primary pressure within the primary cavity.

13. The apparatus of claim 1, wherein the priming system comprises a priming temperature adjusting device in thermal communication with the removable carrier such that a temperature in the secondary cavity is controlled by the priming temperature adjusting device.

14. A method for supplying a target material, the method comprising:
inserting a solid matter that includes the target material into a secondary cavity of a removable carrier;
inserting the removable carrier into a primary cavity of a priming chamber that is connected to a transport system that is in fluid communication with a reservoir system that comprises a reservoir in fluid communication with a nozzle supply system;
maintaining a pressure in at least a portion of the transport system below atmospheric pressure;
reducing a pressure in the primary cavity and the secondary cavity to below atmospheric pressure;
opening a gate valve in the transport system;
heating the inserted solid matter to a temperature above a melting point of the target material until the solid matter turns into fluid matter that includes the target material;
preventing the fluid matter from flowing through the open gate valve until enough solid matter has been converted into fluid matter; and
enabling the fluid matter to drain into the transport system portion and through the opened gate valve after it is determined that enough solid matter has been converted into fluid matter.

15. The method of claim 14, wherein maintaining the pressure in at least the portion of the transport system below atmospheric pressure comprises maintaining the pressure in a refill tank of the transport system below atmospheric pressure, the refill tank being in fluid communication with the reservoir system by way of a refill valve system.

16. The method of claim 14, wherein opening the gate valve in the transport system comprises opening the gate valve in the transport system when it is determined that the pressure in the primary cavity and the secondary cavity is below a threshold pressure.

17. The method of claim 14, wherein connecting the priming chamber to the transport system extending between the removable carrier and the reservoir system comprises inserting a tube wall that extends from the priming chamber and defines an interior that is in fluid communication with a transport opening of the priming chamber into a regulation apparatus, the regulation apparatus configured to control a flow of fluid from the priming chamber.

18. The method of claim 17, wherein connecting the priming chamber to the transport system extending between the removable carrier and the reservoir system comprises connecting the regulation apparatus to a refill tank that defines a refill cavity, the method further comprising providing a fluid flow path between the refill cavity and the reservoir system and a fluid flow path between the regulation apparatus and the refill cavity.

19. The method of claim 14, further comprising trapping non-target material in the removable carrier after the target fluid matter is drained from the removable carrier and into the transport system portion, wherein the non-target material has a density that is lower than a density of the target fluid matter.

20. The method of claim 14, further comprising, after the target fluid matter is drained into the transport system portion, then:
closing the gate valve;
enabling the pressure in the primary cavity to come up to atmospheric pressure; and
removing the removable carrier from the primary cavity.

21. The method of claim 16, wherein determining that the pressure in the primary cavity and the secondary cavity is substantially close to the pressure in the transport system portion comprises determining that the pressures are within $10^{-7}$ Torr of each other.

22. The method of claim 17, wherein connecting the priming chamber to the transport system extending between the removable carrier and the reservoir system comprises connecting the regulation apparatus to the reservoir system, the method further comprising providing a fluid flow path between the regulation apparatus and the reservoir system.

23. The method of claim 14, wherein enabling the fluid matter to drain into the transport system portion and through the opened gate valve comprises enabling fluid matter comprising target fluid matter to drain into the transport system portion and through the opened gate valve.

24. The method of claim 20, further comprises disposing of the removed removable carrier.

25. The method of claim 20, wherein removing the removable carrier comprises removing the trapped non-target material.

26. The method of claim 14, wherein enabling the fluid matter to drain into the transport system portion and through the opened gate valve after it is determined that enough solid matter has been converted into fluid matter comprises enabling the fluid matter to fall out of the secondary cavity of the removable carrier and into the transport system portion due to the force of gravity and without the use of a pressure differential between the secondary cavity and the transport system portion.

27. The method of claim 14, wherein enabling the fluid matter to drain into the transport system portion and through the opened gate valve comprises avoiding contact between the fluid matter and a gate of the opened gate valve.

28. The method of claim 14, wherein maintaining the pressure in at least the portion of the transport system below atmospheric pressure comprises maintaining the pressure in at least the portion of the transport system at or below around $10^{-6}$ Torr.

29. The method of claim 14, wherein reducing the pressure in the primary cavity and the secondary cavity to below atmospheric pressure comprises reducing the pressure in the primary cavity and the secondary cavity to a value that is close to the pressure in the portion of the transport system.

* * * * *